US010504691B2

(12) United States Patent
Han

(10) Patent No.: US 10,504,691 B2
(45) Date of Patent: Dec. 10, 2019

(54) METHOD FOR GENERATING A COMPOSITE IMAGE OF AN OBJECT AND PARTICLE BEAM DEVICE FOR CARRYING OUT THE METHOD

(71) Applicant: Carl Zeiss Microscopy GmbH, Jena (DE)

(72) Inventor: Luyang Han, Heidenheim (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 15/490,934

(22) Filed: Apr. 19, 2017

(65) Prior Publication Data

US 2017/0309443 A1 Oct. 26, 2017

(30) Foreign Application Priority Data

Apr. 22, 2016 (EP) .................................... 16166754

(51) Int. Cl.
*H01J 37/22* (2006.01)
*G06T 7/33* (2017.01)
*G06T 3/40* (2006.01)

(52) U.S. Cl.
CPC .......... *H01J 37/222* (2013.01); *G06T 3/4038* (2013.01); *G06T 7/33* (2017.01); *G06T 2207/10061* (2013.01); *H01J 2237/226* (2013.01)

(58) Field of Classification Search
None
See application file for complete search history.

(56) References Cited

U.S. PATENT DOCUMENTS

| | | | | |
|---|---|---|---|---|
| 6,453,063 | B1 | 9/2002 | Phaneuf et al. | |
| 7,598,492 | B1 | 10/2009 | Krzeczowski et al. | |
| 8,767,038 | B2 * | 7/2014 | Miyamoto ............. | G01B 15/04 250/307 |
| 9,029,855 | B2 | 5/2015 | Ning et al. | |
| 2004/0036031 | A1 | 2/2004 | Rose et al. | |
| 2010/0073472 | A1 * | 3/2010 | Zeineh ................. | G02B 21/367 348/79 |
| 2010/0092070 | A1 | 4/2010 | Young et al. | |
| 2011/0181688 | A1 * | 7/2011 | Miyamoto ............. | G01B 15/04 348/36 |

(Continued)

FOREIGN PATENT DOCUMENTS

| | | | |
|---|---|---|---|
| EP | 2 660 845 | A1 | 11/2013 |
| WO | WO 02/067286 | A2 | 8/2002 |

*Primary Examiner* — Michael J Logie
(74) *Attorney, Agent, or Firm* — Muirhead and Saturnelli, LLC

(57) ABSTRACT

The system described herein relates to a method for generating a composite image of an object using, for example, a particle beam device such as an electron beam device and/or an ion beam device. A composite image is generated by relatively arranging a first sub image to a second sub image such that the first sub image overlaps the second sub image in the entire common region, a calculated first image position of a first marking in the first sub image is arranged on the first image position of the first marking in the second sub image, and a calculated second image position of a second marking in the first sub image is arranged on the second image position of the second marking in the second sub image.

18 Claims, 15 Drawing Sheets

(56) References Cited

U.S. PATENT DOCUMENTS

| | | | | |
|---|---|---|---|---|
| 2012/0092482 | A1* | 4/2012 | Shinoda | H04N 5/23238 348/80 |
| 2012/0112323 | A1 | 5/2012 | Zani et al. | |
| 2013/0101188 | A1 | 4/2013 | Sievers et al. | |
| 2014/0238438 | A1* | 8/2014 | Segev | H01J 37/02 134/1.1 |
| 2014/0240451 | A1* | 8/2014 | Sakano | G01N 21/8806 348/36 |
| 2016/0133434 | A1* | 5/2016 | Kuramoto | H01J 37/222 250/307 |

* cited by examiner

METHOD FOR GENERATING A COMPOSITE IMAGE OF AN OBJECT AND PARTICLE BEAM DEVICE FOR CARRYING OUT THE METHOD

TECHNICAL FIELD

The system described herein relates to generating a composite image of an object and more particularly to a particle beam device such as an electron beam and/or an ion beam device that generates a composite image of an object.

BACKGROUND

Particle beam devices are used for examining samples (hereinafter also called objects) in order to obtain insights with regard to the properties and behaviour of the samples under specific conditions. One of those particle beam devices is an electron beam device, in particular a scanning electron microscope (also known as SEM).

In an SEM, an electron beam (hereinafter also called primary electron beam) is generated using a beam generator. The electrons of the primary electron beam are accelerated to a predeterminable energy and focused by a beam guiding system, in particular an objective lens, onto a sample to be analyzed (that is to say an object to be analyzed). A high-voltage source having a predeterminable acceleration voltage is used for acceleration purposes. Using a deflection unit, the primary electron beam is guided over a surface of the sample to be analyzed. In this case, the electrons of the primary electron beam interact with the material of the sample to be analyzed. In particular, interaction particles and/or interaction radiation arise(s) as a consequence of the interaction. By way of example, electrons are emitted by the sample to be analyzed (so-called secondary electrons) and electrons of the primary electron beam are backscattered at the sample to be analyzed (so-called backscattered electrons). The secondary electrons and backscattered electrons are detected and used for image generation. An image of the sample to be analyzed is thus obtained.

Furthermore, ion beam devices are known which comprise an ion beam column. Using an ion beam generator arranged in the ion beam column, ions are generated which are used for processing a sample (for example for removing a layer of the sample or for depositing material to the sample, wherein the material is provided by a gas injection system) or else for imaging.

Moreover, it is known from the prior art to use combination devices for processing and/or for analyzing a sample, wherein both electrons and ions can be guided onto a sample to be processed and/or to be analyzed. By way of example, it is known for an SEM to be additionally equipped with an ion beam column as mentioned above. In this case, the SEM serves, in particular, for observing the processing, but also for further analysis of the processed or non-processed sample. Electrons may also be used for depositing material. This is known as Electron Beam Induced Deposition (EBID).

There is an increasing demand for large images of large samples generated using a particle beam device. However, since a particle beam may normally be guided over a part of the surface of the sample to be analyzed only, it is known to generate sub images of the sample first, and subsequently to stitch the sub images together to a large image of the sample comprising all the sub images. The sub images are also known as tiles and are generated in such a way that they comprise a common region. For example, it is known to generate a first sub image and a second sub image in such a way that they have a common region. They are stitched together in the common region along their peripheries. The success of this stitching technique depends on how well the generated first sub image and the second sub image can be aligned along the common region. This alignment is also known as registration. The method is known as image stitching.

The known image stitching method may be automatically performed using software comprising image recognition and coordination algorithms. However, for such software to work, the common region of the first sub image and the second sub image should comprise distinct features to allow the image recognition and coordination algorithms to yield a sufficiently result. The distinct features are used as orientation marks (also known as orientation markings) for determining a unique relative position of the first sub image to the second sub image. However, the common region of the first sub image and the second sub image may not have such distinct features or only features which are not very useful for the known image stitching method. For example, a common region of the first sub image and of the second sub image may comprise at least one of the following:

(i) Essentially no or no usable features. Therefore, it may not be possible to find a unique alignment of the first sub image to the second sub image in the area of the common region since there are no or no usable distinct features as orientation marks in the common region. Indeed, no or no usable features may lead to several possible alignments of the first sub image to the second sub image as shown in FIGS. 1A and 1B. A common region CR of the first sub image SI1 and of the second sub image SI2 does not comprise any distinct feature. Therefore, for example, the first sub image SI1 may be aligned to the second sub image SI2 as shown in FIG. 1A or as shown in FIG. 1B. Accordingly, the known stitching method may not reveal a sufficient outcome. It may not be possible to determine a unique relative position of the first sub image SI1 to the second sub image SI2.

(ii) Features that are repetitive. Such features are often found on semiconductor circuit objects. FIGS. 2A and 2B show a first sub image SI1, a second sub image SI2 and a common region CR comprising a repetitive feature RF. In this case, the alignment of the first sub image SI1 to the second sub image S12 in a specific direction will generally be uncertain by n×P, where P is the repetition in the specific direction and n is a natural number. Therefore, for example, the first sub image SI1 may be aligned to the second sub image S12 as shown in FIG. 2A or as shown in FIG. 2B. Accordingly, the known stitching method may not reveal a sufficient outcome. It may not be possible to determine a unique relative position of the first sub image SI1 to the second sub image S12.

(iii) Features that extend from the first sub image to the second sub image along a common straight line. Those lines are often found on crystalline samples. FIGS. 3A and 3B show a first sub image SI1, a second sub image SI2 and a common region CR comprising a line L. In this case, the size of the common region CR is unclear. For example, the first sub image SI1 may be aligned to the second sub image S12 as shown in FIG. 3A, wherein the common region CR has a first size, or as shown in FIG. 3B, wherein the common region CR has a second size. Accordingly, the known stitching method may not reveal a sufficient outcome. It may not be possible to determine a unique relative position of the first sub image SI1 to the second sub image S12.

If there is no distinct feature which may be used as an orientation mark, the known image stitching method may comprise the step of generating distinct features on the object, wherein the generated distinct features may be used as orientation marks in the known image stitching method. However, the object as such is modified which may not be desired. Moreover, the generated orientation marks may not be removable from the object. This also may not be desired.

A further known image stitching method for aligning a first sub image to a second sub image comprises the following steps: detecting a first type of output radiation, generating a first sub image using the first type of output radiation, detecting a second type of output radiation, generating a second sub image using the second type of output radiation and determining a shift between the first sub image and the second sub image. However, this known method requires extensive intervention of a user of a particle beam device used for carrying out the known method.

Another known image stitching method requires an extensive prior knowledge of the sample to be analyzed such that an optimum tilting of an imaged region of interest of the sample can be deduced, thereby avoiding having undesired features in the common region. Undesired features may lead to a false relative alignment of the sub images to each other.

As regards prior art, reference is made in particular to patent documents EP 2 660 845 A1, U.S. Pat. No. 8,767,038 B2 and U.S. Pat. No. 9,029,855 B2 as prior art.

In light of the aforesaid, it is desirable to provide a method for generating a composite image of an object and a particle beam device for carrying out the method which provide for an unique alignment of sub images to each other, even if no or unusable features are given in the sub images as orientation marks for the alignment, wherein the method is less extensive than the prior art.

SUMMARY OF THE INVENTION

The system described herein may be used for generating a composite image of an object to be imaged using a particle beam device, for example an electron beam device and/or an ion beam device. The particle beam device may comprise a particle generator for generating a particle beam having charged particles and an objective lens for focusing the particle beam onto the object. The charged particles may be electrons and/or ions. Moreover, the particle beam device may comprise a detection unit for detecting interaction particles and/or interaction radiation, the interaction particles and the interaction radiation arising from an interaction of the particle beam with the object when the particle beam impinges on the object. The interaction particles may be secondary particles, for example secondary electrons, or backscattered particles, for example backscattered electrons. The interaction radiation may be X-rays or cathodoluminescence light.

The composite image may comprise at least a first sub image and at least a second sub image. In other words, the composite image may be composed of the first sub image and the second sub image. However, the invention is not restricted to two sub images. Instead, the composite image may also comprise more than two sub images, for example 4 to 20 sub images or any other number of sub images which may be suitable to carry out the method according to the system described herein.

The system described herein includes the step of determining a first object region of the object. The first object region may be a part of a surface of the object. Moreover, the method according to the system described herein comprises the step of guiding the particle beam to the first object region and generating a first sub image of the first object region by detecting interaction particles and/or interaction radiation using the detection unit. Moreover, the method according to the system described herein comprises (i) the step of arranging at least a first marking in the first object region at a first object position in an object coordinate system, and (ii) the step of arranging at least a second marking in the first object region at a second object position in the object coordinate system. The first marking and/or the second marking may have any suitable design. In particular, the first marking and/or the second marking may be a hole, a recess, an elevation and/or a coating. Furthermore, the first marking and/or the second marking may have any design which changes a contrast in an image and, therefore, may be identified. For example, the first marking and/or the second marking may be designed using material interacting differently with the particle beam than the rest of the object. Moreover, the first marking and the second marking may be shaped differently or designed differently. The first marking and the second marking may have any suitable design. For example, they may be shaped 2-dimensional, for example like a circle, a cross and/or a line. Moreover, they may be shaped 3-dimensional, for example like a cone, a ball and/or a pyramid. In particular, the first marking may be a hole, whereas the second marking may be a coating. In a further embodiment, the first marking and/or the second marking may be identified and detected by a specific detection unit only, for example by a detection unit for interaction particles only or by a detection unit for interaction radiation only.

Moreover, a first image position of the first marking in the first sub image using an image coordinate system is determined by using calculations. Therefore, the first image position of the first marking in the first sub image using the image coordinate system is calculated. The first image position in the image coordinate system corresponds to the first object position in the object coordinate system. The step of determining the first image position of the first marking in the first sub image does not mean that the first sub image actually shows the first marking since the first marking is arranged in the first object region after the first sub image was generated. Instead, it is calculated at which position the first marking would be shown in the first sub image if the first sub image would have been generated after having arranged the first marking in the first object region.

Moreover, the method according to the system described herein comprises the step of determining a second image position of the second marking in the first sub image using the image coordinate system by using calculations. Accordingly, the second image position of the second marking in the first sub image using the image coordinate system is calculated. The second image position in the image coordinate system corresponds to the second object position in the object coordinate system. Again, the step of determining the second image position of the second marking in the first sub image does not mean that the first sub image actually shows the second marking since the second marking is also arranged in the first object region after the first sub image was generated. Instead, it is calculated at which position the second marking would be shown in the first sub image if the first sub image would have been generated after having arranged the second marking in the first object region. In an embodiment of the method according to the system described herein, a model of the first sub image may be generated, namely by including the first marking into the generated first sub image at the calculated first image position and by including the second marking into the generated first sub image at the calculated second image position.

The method according to the system described herein also comprises the step of determining a second object region of the object to be imaged, wherein the second object region comprises a common region with the first object region, wherein the common region comprises the first marking and the second marking. Moreover, the particle beam is guided to the second object region, and a second sub image of the second object region is generated by detecting interaction particles and/or interaction radiation using the detection unit. As mentioned above, the first marking and the second marking are generated after the first sub image has been generated. Therefore, the image of the common region in the first sub image does not show the first marking and the second marking. However, the image of the common region in the second sub image shows the first marking and the second marking.

The method according to the system described herein also comprises the step of determining a first image position of the first marking in the second sub image using the image coordinate system and also the step of determining a second image position of the second marking in the second sub image using the image coordinate system. Additionally, the method according to the system described herein comprises the step of generating the composite image by relatively arranging the first sub image to the second sub image such that the first sub image overlaps the second sub image in the entire common region, the calculated first image position of the first marking in the first sub image is arranged on the first image position of the first marking in the second sub image, and that the calculated second image position of the second marking in the first sub image is arranged on the second image position of the second marking in the second sub image.

The step of arranging of the first sub image and the second sub image may be carried out by moving the first sub image to the second sub image and/or by moving the second sub image to the first sub image. Moreover, the step of arranging the first sub image and the second sub image is the image stitching step of the method according to the system described herein.

The method according to the system described herein is based on the idea to generate distinctive features, in particular the first marking and the second marking which are used as alignment features on demand for the method according to the system described herein. The method according to the invention is not restricted to use two markings only. Instead, any suitable number of markings may be used, for example 3 to 30. As explained above, the first marking and the second marking are not shown in the first sub image such that when relatively arranging the first sub image and the second sub image to each other, the first sub image may overlap the second sub image. Therefore, the first marking and the second marking are not shown in the composite image, although the first marking and the second marking were arranged on the object.

The first marking and the second marking may be designed to facilitate an automatic process of generating the composite image such that the image stitching of generated sub images may be performed with high reliability independent of the features arranged on the surface of the object. Moreover, there is a potential low computation time to achieve the step of relatively arranging the first sub image to the second sub image since a low number of correlations are to be calculated, in particular the calculated position of the first marking in the first sub image to the first image position of the first marking in the second sub image and the calculated position of the second marking in the first sub image to the second image position of the second marking in the second sub image.

It is additionally or alternatively provided in an embodiment of the system described herein that the first shift of the first image position of the first marking in the first sub image to the first image position of the first marking in the second sub image is determined. Moreover, a second shift of the second image position of the second marking in the first sub image to the second image position of the second marking in the second sub image is determined. The step of arranging the first sub image to the second sub image now uses the first shift and/or the second shift. The first shift and/or the second shift comprises information about the distance between the first sub image and the second sub image as well as the direction into which the first sub image is relatively arranged to the second sub image to generate the composite image.

Furthermore, it is additionally or alternatively provided in an embodiment of the method according to the system described herein that the first marking may be arranged in the first object region at the first object position using the particle beam. Moreover, the second marking may be arranged in the first object region at the second object position using the particle beam.

It is additionally or alternatively provided in a further embodiment of the method according to the system described herein that the first marking is removable from the first object region and/or that the second marking is removable from the first object region. For example, the first marking and/or the second marking is/are generated by using an electron beam induced deposition (EBID) of carbon on the object. For example, a few nanometers, for example 1 nm to 10 nm, of carbon are deposited on the object as the first marking and/or the second marking. Such a few nanometers of carbon are sufficient to deliver a distinguished contrast in the first sub image and the second sub image. The deposited carbon may be removed, for example by using a plasma without damaging the object.

In a further embodiment of the method according to the system described herein it is additionally or alternatively provided that the method comprises at least one of the following features:

the first marking is removed from the first object region;

the first marking is removed from the first object region using the particle beam;

the first marking is removed from the first object region using a plasma;

the second marking is removed from the first object region;

the second marking is removed from the first object region using the particle beam; and the second marking is removed from the first object region using a plasma.

Furthermore, it is additionally or alternatively provided in an embodiment of the method according to the system described herein that the particle generator is a first particle generator for generating a first particle beam of first charged particles and that the objective lens is a first objective lens for focusing the first particle beam onto the object. The particle beam device may further comprise a second particle generator for generating a second particle beam of second charged particles. Furthermore, the particle beam device may also comprise a second objective lens for focusing the second particle beam onto the object. The method according to the system described herein may alternatively or additionally comprise at least one of the following features:

the first sub image of the first object region is generated using the first particle beam;

the second sub image of the second object region is generated using the first particle beam;

the first marking is arranged in the first object region at the first object position using the second particle beam; and the second marking is arranged in the first object region at the second object position using the second particle beam.

In a further embodiment of the method according to the system described herein it is additionally or alternatively provided that the first marking is removed from the first object region using the first particle beam and/or the second particle beam. Additionally or alternatively, the second marking is removed from the first object region using the first particle beam and/or the second particle beam.

In a further embodiment of the method according to the system described herein it is additionally or alternatively provided that the invention is not restricted to the use of two markings only. Rather, this embodiment of the method according to the system described herein additionally or alternatively comprises arranging at least a third marking in the first object region at a third object position in the object coordinate system. A third image position of the third marking in the first sub image using the image coordinate system is calculated, wherein the third image position corresponds to the third object position in the object coordinate system. The common region also comprises the third marking. The embodiment of the method also comprises determining a third image position of the third marking in the second sub image using the image coordinate system. The composite image is generated by relatively arranging the first sub image to the second sub image such that the calculated third image position of the third marking in the first sub image is arranged on the third image position of the third marking in the second sub image.

In a further embodiment of the method according to the system described herein it is additionally or alternatively provided that the first marking, the second marking and the third marking are arranged in the first object region in such a way that two markings of the group comprising the first marking, the second marking and the third marking are arranged on an imaginary straight line. The remaining marking of the group comprising the first marking, the second marking and the third marking is arranged in a distance to the imaginary straight line. For example, the first marking and the second marking are arranged on the imaginary straight line. The third marking is arranged in a distance to the imaginary straight line.

All above mentioned features with respect to the first marking and to the second marking also apply to the third marking in an analogous manner.

The system described herein also refers to a computer program product comprising a program code which may be loaded or is loaded into a processor and which, when being executed, controls a particle beam device in such a way that a method comprising at least one of the above mentioned or further below mentioned steps or a combination of at least two of the above mentioned or further below mentioned steps is carried out.

The system described herein also refers to a particle beam device for analyzing an object. The particle beam device comprises at least one particle generator for generating a particle beam comprising charged particles. The charged particles may be electrons and/or ions. The particle beam device also has at least one objective lens for focusing the particle beam onto the object. Moreover, the particle beam device comprises at least one detection unit for detecting interaction particles and/or interaction radiation, the interaction particles and the interaction radiation arising when the particle beam impinges on the object. The interaction particles may be secondary particles and/or backscattered particles, in particular secondary electrons and backscattered electrons. The interaction radiation may be X-rays and/or cathodoluminescence light. Moreover, the particle beam device comprises at least one processor into which a computer program product as above mentioned is loaded.

In an embodiment of the particle beam device according to the system described herein it is additionally or alternatively provided that the particle generator is a first particle beam generator for generating a first particle beam comprising first charged particles. The objective lens is a first objective lens for focusing the first particle beam onto the object. The particle beam device further comprises a second particle beam generator for generating a second particle beam comprising second charged particles and a second objective lens for focusing the second particle beam onto the object.

In an embodiment of the particle beam device according to the system described herein it is additionally or alternatively provided that the particle beam device is at least one of the following: an electron beam device or an ion beam device. In particular, the particle beam device may be both an electron beam device and an ion beam device.

In an embodiment of the particle beam device according to the system described herein it is additionally or alternatively provided that particle beam device has a plasma cleaning unit, for example to remove the first marking and/or the second marking.

BRIEF DESCRIPTION OF DRAWINGS

Embodiments of the system described herein described herein will be explained in more detail in the following text with reference to the figures, in which.

DETAILED DESCRIPTION OF VARIOUS EMBODIMENTS

Figure 1A:
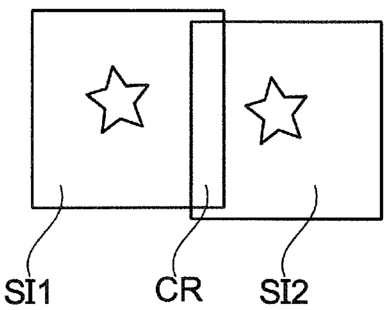
FIG. 1A, 1B show a first sub image and a second sub image, both having a common region comprising no distinct features.
Figure 1B:
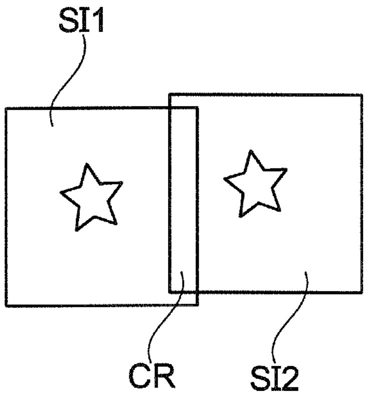
Figure 2A:
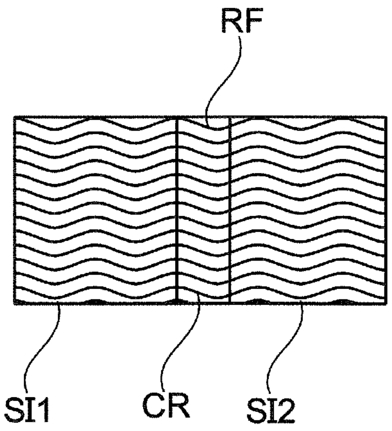
FIG. 2A, 2B show a first sub image and a second sub image, both having a common region comprising periodic features.
Figure 2B:
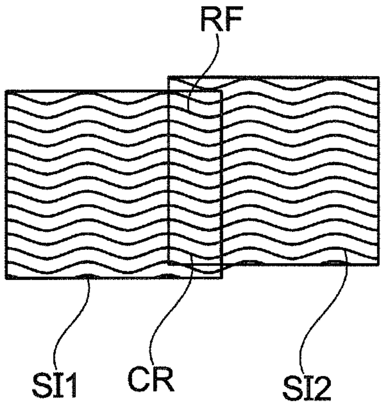
Figure 3A:
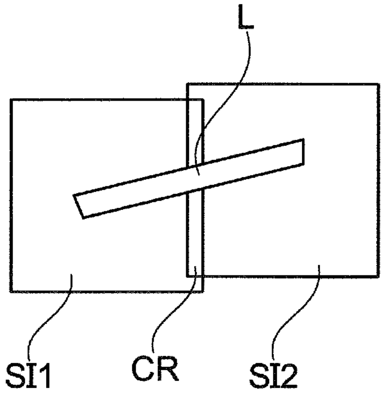
FIG. 3A, 3B show a first sub image and a second sub image, both having a common region comprising a straight line as a feature.
Figure 3B:
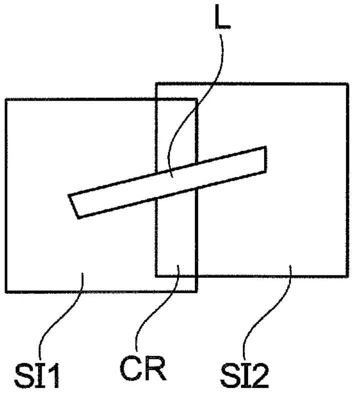
Figure 4:
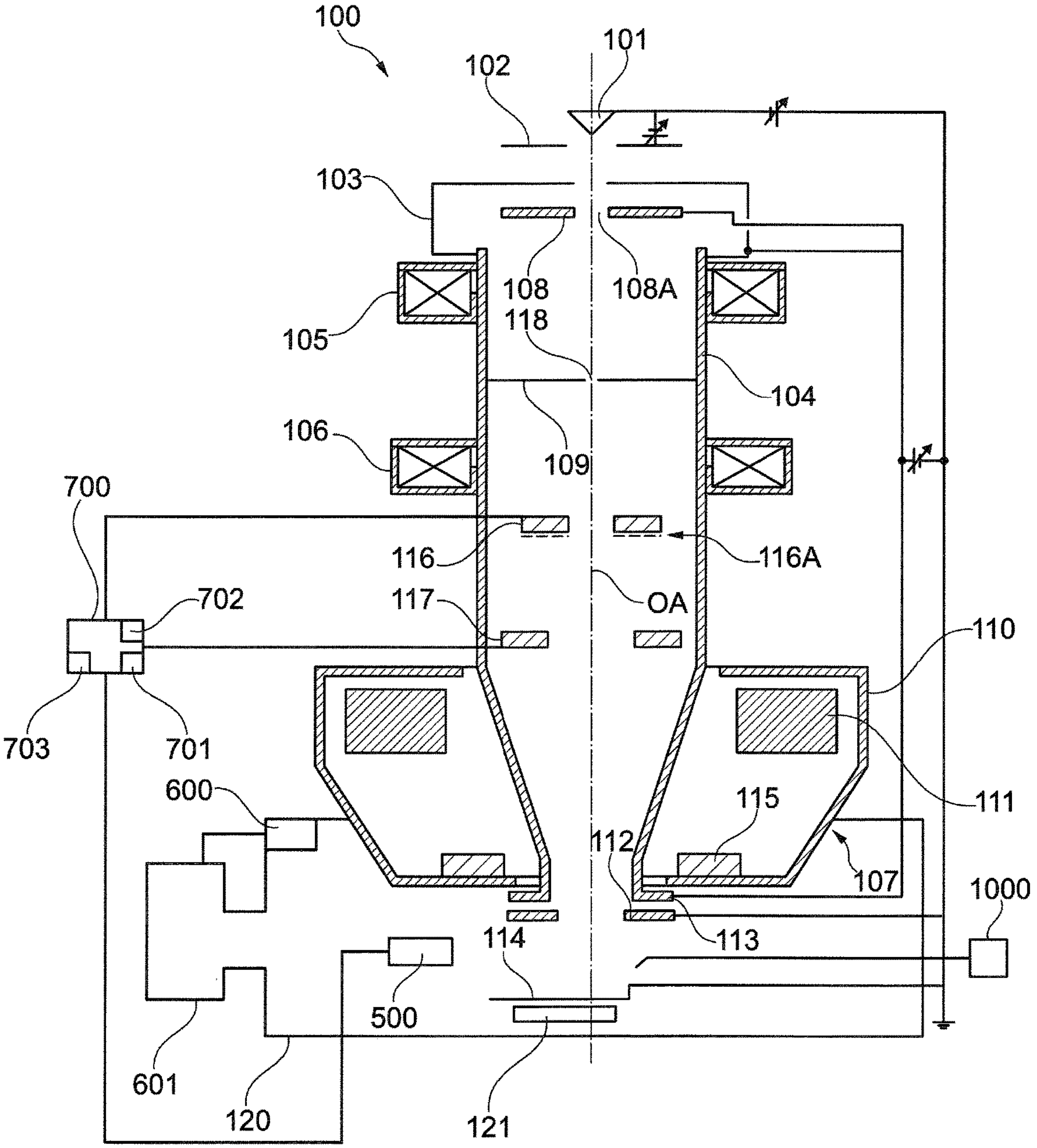
FIG. 4 shows a schematic representation of a first embodiment of a particle beam device according to the system described herein.

FIG. 4 shows a schematic representation of an SEM 100. The SEM 100 has a beam generator in the form of an electron source 101 being a cathode, an extraction electrode 102, and an anode 103 which is arranged on the end of a beam guide tube 104 of the SEM 100. The electron source 101 is, for example, a thermal field emitter. However, the invention is not limited to such an electron source. Instead, any electron source may be used.

Electrons emerging from the electron source 101 form a primary electron beam. The electrons are accelerated to an anode potential due to a potential difference between the electron source 101 and the anode 103. The anode potential in this exemplary embodiment is between 0.2 kV and 30 kV relative to the ground potential of an object chamber 120, for example, 5 kV to 15 kV, in particular 8 kV, but alternatively, it could also be at ground potential.

Two condenser lenses are arranged at the beam guide tube 104, i.e., a first condenser lens 105 and a second condenser lens 106, the first condenser lens 105 being situated first, and then the second condenser lens 106, as viewed from the electron source 101 toward an objective lens 107. However, the invention is not limited to the use of two condenser lenses. Instead, further embodiments may comprise only a single condenser lens.

A first aperture unit 108 is arranged between the anode 103 and the first condenser lens 105. The first aperture unit 108 is, together with the anode 103 and the beam guide tube 104, at high-voltage potential, i.e. the potential of the anode 103, or at ground. The first aperture unit 108 may have several first aperture openings 108A. One of those first aperture openings 108A is shown in FIG. 4. For example, the first aperture unit 108 has two first aperture openings 108A. Each of the several first aperture openings 108A may have a different opening diameter. A chosen first aperture opening 108A may be arranged at an optical axis OA of the SEM 100 using an adaption mechanism. However, the invention is not limited to this embodiment. Instead, in an alternative embodiment, the first aperture unit 108 may have a single first aperture opening 108A only. No adaption mechanism is used for this alternative embodiment. The first aperture unit 108 of this alternative embodiment is fixedly arranged around the optical axis OA.

A stationary second aperture unit 109 is arranged between the first condenser lens 105 and the second condenser lens 106. Alternatively, the second aperture unit 109 is moveable.

The objective lens 107 has pole pieces 110, in which a bore has been made. The beam guide tube 104 is arranged and guided through this bore. Further, a coil 111 is arranged in the pole pieces 110.

An electrostatic deceleration device is situated downstream from the beam guide tube 104. It has a single electrode 112 and a tube electrode 113 arranged at the end of the beam guide tube 104 facing an object 114. Consequently, the tube electrode 113 is, together with the beam guide tube 104, at the potential of the anode 103, while the single electrode 112 and the object 114 are at a lower potential than that of the anode 103. In this case, this is the ground potential of the object chamber 120. Thus, the electrons of the primary electron beam may be decelerated to the desired energy required for analyzing the object 114.

In addition, the SEM 100 has a scanning device 115, via which the primary electron beam may be deflected and scanned across the object 114. In this process, the electrons of the primary electron beam interact with the object 114. As a consequence of this interaction, interaction particles and/or interaction radiation will result, which are detected. The detection signals obtained in this manner are evaluated.

As interaction particles, in particular electrons are emitted from the surface of the object 114 (so-called secondary electrons) or electrons of the primary electron beam are scattered back (so-called backscattered electrons). For detecting secondary electrons and/or backscattered electrons, a detector system which has a first detector 116 and a second detector 117 is arranged in the beam guide tube 104. The first detector 116 is arranged on the source-side along the optical axis OA, while the second detector 117 is arranged on the object-side along the optical axis OA in the beam guide tube 104. In addition, the first detector 116 and the second detector 117 are arranged offset against each other toward the optical axis OA of the SEM 100. Both the first detector 116 and the second detector 117 each have a through opening through which the primary electron beam may pass, and they are approximately at the potential of the anode 103 and the beam guide tube 104. The optical axis OA of the SEM 100 passes through the corresponding through openings.

The second detector 117 is used to detect mostly secondary electrons. Secondary electrons emitting from the object 114 have a low kinetic energy and arbitrary direction of movements. However, the secondary electrons are accelerated due to a strong extraction field generated by the tube electrode 113 in the direction of the objective lens 107. The secondary electrons enter the objective lens 107 nearly parallel to the optical axis OA. A diameter of the beam bunch of the secondary electrons is small in the objective lens 107.

The objective lens 107, however, affects the beam of secondary electrons and generates a short focus of the secondary electrons having relatively steep angles with respect to the optical axis OA such that the secondary electrons diverge from each other after the focus and may impinge on the second detector 117. Electrons backscattered on the object 114, i.e. backscattered electrons, have a relatively high kinetic energy as compared to secondary electrons when exiting from the object 114. Backscattered electrons are detected only to a very small degree by the second detector 117. The high kinetic energy and the angle of the beam of backscattered electrons with respect to the optical axis OA when backscattered at the object 114 result in a beam waist, i.e. a beam area having a minimal diameter, of the backscattered electrons, the beam waist being arranged in the vicinity of the second detector 117. Therefore, a large part of the backscattered electrons passes through the opening of the second detector 117. Accordingly, backscattered electrons are detected mainly by the first detector 116.

The first detector 116 of a further embodiment of the SEM 100 may have an opposing field grid 116A which is a field grid with an opposing potential. The opposing field grid 116A may be arranged at the side of the first detector 116 facing the object 114. The opposing field grid 116A may comprise a negative potential with respect to the potential of the beam guide tube 104 such that mainly or only backscattered electrons having a high energy may pass the opposing field grid 116A and impinge on the first detector 116. Additionally or alternatively the second detector 117 may have a further opposing field grid being designed similar to the above mentioned opposing field grid 116A of the first detector 116 and having an analog function.

The detection signals generated by the first detector 116 and the second detector 117 are used to generate an image or images of the surface of the object 114. It is pointed out expressly that the aperture openings of the first aperture unit 108 and the second aperture unit 109 as well as the through openings of the first detector 116 and the second detector 117 are represented in an exaggerated manner. The through openings of first detector 116 and the second detector 117 have a maximum length of between 1 mm and 5 mm perpendicular to the optical axis OA. For example, they have a circular design and a diameter in the range of 1 mm to 3 mm perpendicular to the optical axis OA.

In the exemplary embodiment shown here, the second aperture unit 109 is a circular aperture having a second aperture opening 118 for the primary electron beam to pass through, the second aperture opening 118 having an extension in the range of 25 μm to 50 μm, for example, 35 μm. The second aperture unit 109 may be a pressure stage aperture. The second aperture unit 109 of a further exemplary embodiment may have several openings which may be mechanically moved with respect to the primary electron beam or which may be passed through by the primary electron beam using electrical and/or magnetic deflection devices. As mentioned above, the second aperture unit 109 may also be a pressure stage unit. It separates a first area, in which the electron source 101 is arranged, having an ultra-high vacuum ($10^{-7}$ to $10^{-12}$ hPa), from a second area with a high vacuum ($10^{-3}$ to $10^{-7}$ hPa). The second area is the intermediate pressure area of the beam guide tube 104 leading to the object chamber 120.

In addition to the detector system mentioned above, the SEM 100 has a radiation detector 500 which is arranged in the object chamber 120. The radiation detector 500 is, for example, positioned between the beam guide tube 104 and the object 114. Moreover, the radiation detector 500 is positioned at the side of the object 114. The radiation detector 500 may be a CCD-detector.

The object chamber 120 is operated in a first pressure range or in a second pressure range, wherein the first pressure range only comprises pressures lower than or equal to $10^{-3}$ hPa and wherein the second pressure range only comprises pressures equal to or over $10^{-3}$ hPa. A pressure sensor 600 is arranged in the object chamber 120 for measuring the pressure in the object chamber 120. A pump system 601 being connected to the pressure sensor 600 and being arranged at the object chamber 120 provides for the pressure range, either the first pressure range or the second pressure range, in the object chamber 120.

The SEM 100 may further have a third detector 121 which is arranged in the object chamber 120. The third detector 121 is arranged downstream of the object 114 as seen from the electron source 101 in the direction of the object 114 along the optical axis OA. The primary electron beam may be transmitted through the object 114. Electrons of the primary electron beam interact with the material of the object 114. Electrons transmitted through the object 114 will be detected using the third detector 121.

The first detector 116, the second detector 117 and the radiation detector 500 are connected to a control unit 700. The control unit 700 comprises a processor 701 into which a computer program product comprising a program code is loaded, which, when being executed, controls the SEM 100 in such a way that a method according to the invention is carried out. This will be explained further below. The control unit 700 also comprises a storage unit 702 and a display unit 703.

The SEM 100 may also comprise a plasma cleaning unit 1000 which may be used for cleaning the surface of the object 114, as will be explained further below.

Figure 4A:
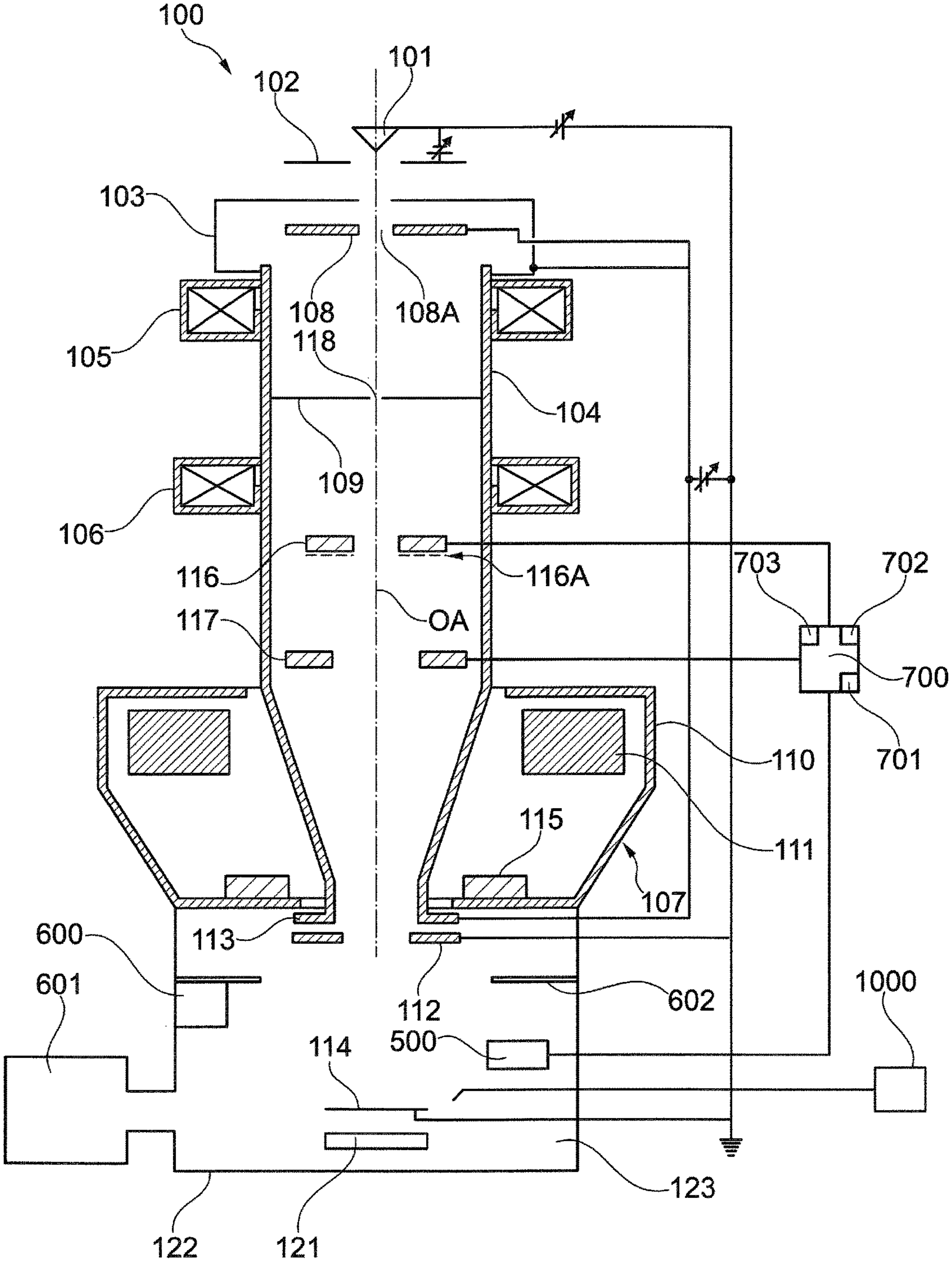
FIG. 4A shows a schematic representation of a second embodiment of a particle beam device according to the system described herein.

FIG. 4A shows a schematic representation of a further SEM 100. The embodiment of FIG. 4A is based on the embodiment of FIG. 4. Identical reference signs denote identical components. In contrast to the SEM 100 of FIG. 4, the SEM 100 of FIG. 4A comprises an object chamber 122. A pressure limiting aperture 602 is arranged between the beam guide tube 104 and an object area 123 of the object chamber 122. The SEM 100 according to FIG. 4A is suited in particular for the SEM 100 being operated in the second pressure range.

Figure 5:
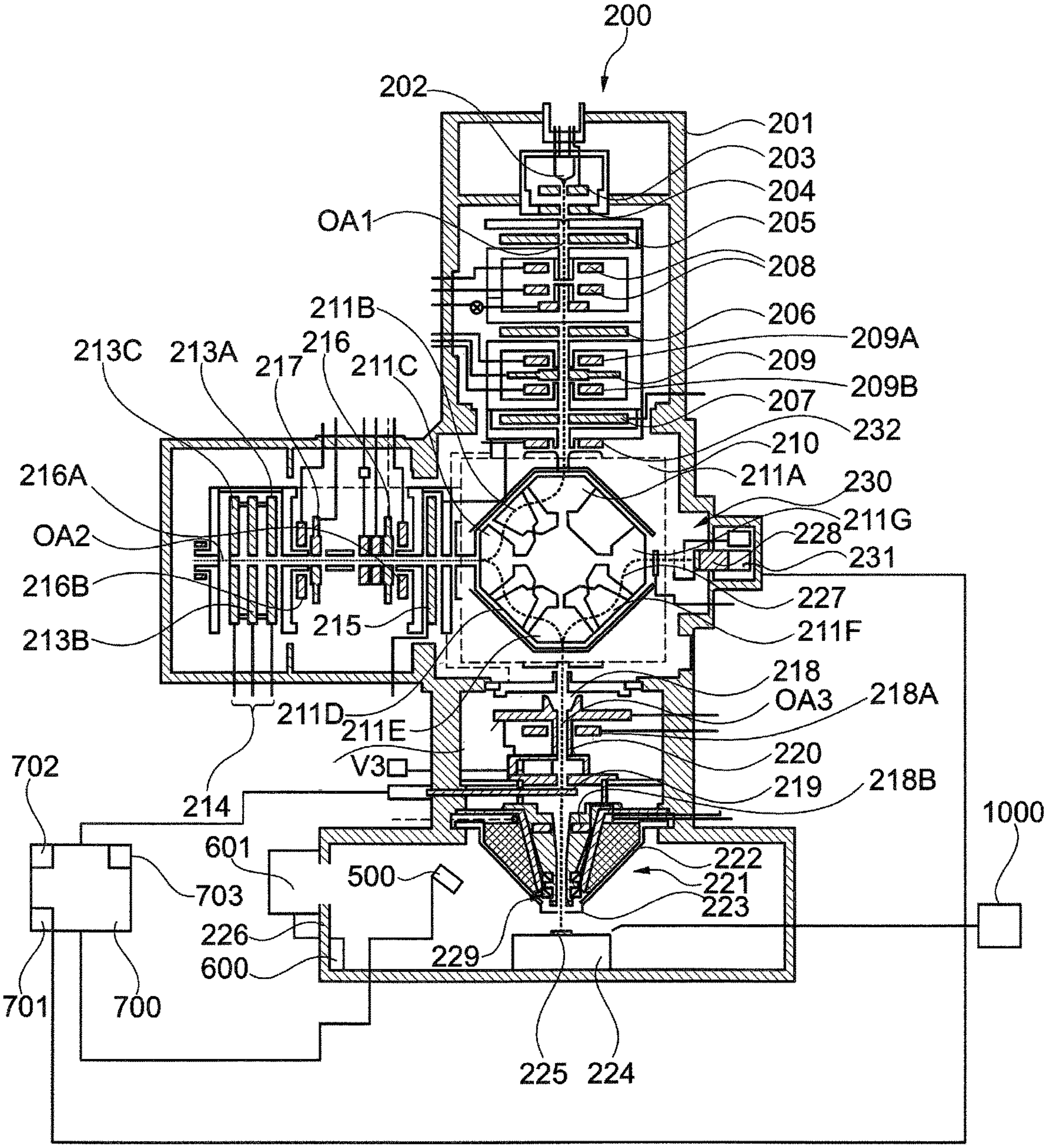
FIG. 5 shows a schematic representation of a third embodiment of a particle beam device according to the system described herein.

FIG. 5 is a schematic illustration of a further embodiment of a particle beam device according to the system described herein. This embodiment of the particle beam device is denoted with reference sign 200 and comprises a mirror corrector for correcting, for example, chromatic and spherical aberrations. The particle beam device 200 comprises a particle beam column 201 being embodied as an electron beam column and, in principle, corresponds to an electron beam column of a corrected SEM. However, the particle beam device 200 according to the invention is not restricted to an SEM with a mirror corrector. Rather, any particle beam device comprising correction units may be used.

The particle beam column 201 comprises a beam generator in the form of an electron source 202 being a cathode, an extraction electrode 203 and an anode 204. By way of example, the electron source 202 may be a thermal field emitter. Electrons which emerge from the electron source 202 are accelerated by the anode 204 as a result of a potential difference between the electron source 202 and the anode 204. Accordingly, a primary particle beam in the form of an electron beam is provided along a first optical axis OA1.

The primary particle beam is guided along a beam path which—after the primary particle beam has emerged from the electron source 202—is approximately the first optical axis OA1, using a first electrostatic lens 205, a second electrostatic lens 206 and a third electrostatic lens 207.

The primary particle beam is adjusted along the beam path using at least one beam alignment device. The beam alignment device of this embodiment comprises a gun alignment unit comprising two magnetic deflection units 208 arranged along the first optical axis OA1. Furthermore, the particle beam device 200 comprises electrostatic beam deflection units. A first electrostatic beam deflection unit 209 is arranged between the second electrostatic lens 206 and the third electrostatic lens 207. The first electrostatic beam deflection unit 209 is also arranged downstream of the magnetic deflection units 208. A first multipole unit 209A in the form of a first magnetic deflection unit is arranged at one side of the first electrostatic beam deflection unit 209. Furthermore, a second multipole unit 209B in the form of a second magnetic deflection unit is arranged at the other side of the first electrostatic beam deflection unit 209. The first electrostatic beam deflection unit 209, the first multipole unit 209A and the second multipole unit 209B are used for adjusting the primary particle beam with respect to an axis of the third electrostatic lens 207 and an entrance window of a beam deflection device 210. The first electrostatic beam deflection unit 209, the first multipole unit 209A and the second multipole unit 209B may act together as a Wien filter. A further magnetic deflection device 232 is arranged at the entrance of the beam deflection device 210.

The beam deflection device 210 is used as a particle-optical beam splitter which deflects the primary particle beam in a specific way. The beam deflection device 210 comprises several magnetic sectors, namely a first magnetic sector 211A, a second magnetic sector 211B, a third magnetic sector 211C, a fourth magnetic sector 211D, a fifth magnetic sector 211E, a sixth magnetic sector 211F and a seventh magnetic sector 211G. The primary particle beam enters the beam deflection device 210 along the first optical axis OA1 and is deflected by the beam deflection device 210 in the direction of a second optical axis OA2. The beam deflection is provided by the first magnetic sector 211A, the second magnetic sector 211B and the third magnetic sector 211C at an angle of 30° to 120°. The second optical axis OA2 is arranged at an identical angle to the first optical axis OA1. The beam deflection device 210 also deflects the primary particle beam which is guided along the second optical axis OA2 in the direction of a third optical axis OA3. The beam deflection is provided by the third magnetic sector 211C, the fourth magnetic sector 211D and the fifth magnetic sector 211E. In the embodiment shown in FIG. 5, deflecting to the second optical axis OA2 and to the third optical axis OA3 will be done by deflecting the primary particle beam at an angle of 90°. Thus, the third optical axis OA3 runs coaxially to the first optical axis OA1. However, the particle beam device 200 according to the invention is not restricted to deflection angles of 90°. Instead, any suitable deflection angle may be used with the beam deflection device 210, for example 70° or 110° such that the first optical axis OA1 does not run coaxially to the third optical axis OA3. For further details of the beam deflection device 210 reference is made to WO 2002/067286 A2, which is incorporated herein by reference.

After being deflected by the first magnetic sector 211A, the second magnetic sector 211B and the third magnetic sector 211C, the primary particle beam is guided along the second optical axis OA2. The primary particle beam is guided to an electrostatic mirror 214 and passes—on its way to the electrostatic mirror 214—a fourth electrostatic lens 215, a third multipole unit 216A in the form of a magnetic deflection unit, a second electrostatic beam deflection unit 216, a third electrostatic beam deflection unit 217 and a fourth multipole unit 216B in the form of a magnetic deflection unit. The electrostatic mirror 214 comprises a first mirror electrode 213A, a second mirror electrode 213B and a third mirror electrode 213C. Electrons of the primary particle beam which are reflected back by the electrostatic mirror 214 run again along the second optical axis OA2 and enter again the beam deflection device 210. They are deflected by the third magnetic sector 211C, the fourth magnetic sector 211D and the fifth magnetic sector 211E towards the third optical axis OA3. The electrons of the primary particle beam exit the beam deflection device 210, being guided along the third optical axis OA3 to the object 225 to be examined. On its way to the object 225, the primary particle beam passes a fifth electrostatic lens 218, a beam guiding tube 220, a fifth multipole unit 218A, a sixth multipole unit 218B and an objective lens 221. The fifth electrostatic lens 218 is an electrostatic immersion lens. The primary particle beam is decelerated or accelerated by the fifth electrostatic lens 218 to the electrical potential of the beam guiding tube 220.

The primary particle beam is focused by the objective lens 221 in a focal plane in which the object 225 is positioned. The object 225 is arranged on a movable sample stage 224. The movable sample stage 224 is arranged in an object chamber 226 of the particle beam device 200.

The objective lens 221 may be implemented as a combination of a magnetic lens 222 and a sixth electrostatic lens 223. The end of the beam guiding tube 220 may be one electrode of an electrostatic lens. Particles of the primary particle beam, after exiting from the beam guiding tube 220, are decelerated to the potential of the object 225 arranged on the sample stage 224. The objective lens 221 is not restricted to a combination of the magnetic lens 222 and the sixth electrostatic lens 223. Instead, the objective lens 221 may be implemented in any suitable form. In particular, the objective lens 221 may also be just a mere magnetic lens or just a mere electrostatic lens.

The primary particle beam focused on the object 225 interacts with the object 225. Interaction particles and interaction radiation are generated. In particular, secondary electrons are emitted by the object 225 and backscattered electrons are returned from the object 225. The secondary electrons and the backscattered electrons are again accelerated and are guided into the beam guiding tube 220 along the third optical axis OA3. In particular, the secondary electrons and backscattered electrons travel on the beam path of the primary particle beam in the opposite direction of the primary particle beam.

The particle beam device 200 comprises a first detector 219 which is arranged along the beam path between the beam deflection device 210 and the objective lens 221. Secondary electrons which are guided in directions oriented at large angles with respect to the third optical axis OA3 are detected by the first detector 219. However, backscattered electrons and secondary electrons which are guided in directions having a small axial distance with respect to the third optical axis OA3 at the first detector 219, i.e. backscattered electrons and secondary electrons having a small distance to the third optical axis OA3 at the position of the first detector 219, enter the beam deflection device 210 and are deflected by the fifth magnetic sector 211E, the sixth magnetic sector 211F and the seventh magnetic sector 211G along a detection beam path 227 to a second detector 228 of an analysis unit 231. The total deflection angle may be, for example, 90° or 110°.

The first detector 219 generates detection signals mostly based on the emitted secondary electrons. The second detector 228 of the analysis unit 231 generates detection signals mostly based on backscattered electrons. The detection signals generated by the first detector 219 and the second detector 228 are transmitted to a control unit 700 and are used to obtain information about the properties of the interaction area of the focused primary particle beam with the object 225. If the focused primary particle beam is scanned over the object 225 using a scanning device 229, and if the control unit 700 acquires and stores the detection signals generated by the first detector 219 and the second detector 228, an image of the scanned area of the object 225 can be acquired and displayed by the control unit 700 or a display unit 703.

A filter electrode 230 may be arranged in front of the second detector 228 of the analysis unit 231. The filter electrode 230 may be used to separate the secondary electrons from the backscattered electrons due to the kinetic energy difference between the secondary electrons and the backscattered electrons.

In addition to the first detector 219 and the second detector 228, the particle beam device 200 also has a radiation detector 500 which is arranged in the object chamber 226. The radiation detector 500 is positioned at the side of the object 225 and is directed to the object 225. The radiation detector 500 may be a CCD-detector and detects interaction radiation arising from the interaction of the primary particle beam with the object 225, in particular X-rays and/or cathodoluminescence light.

The object chamber 226 is operated in a first pressure range or in a second pressure range, wherein the first pressure range only comprises pressures lower than or equal to $10^{-3}$ hPa and wherein the second pressure range only comprises pressures equal to or over $10^{-3}$ hPa. A pressure sensor 600 is arranged in the object chamber 226 for measuring the pressure in the object chamber 226. A pump system 601 being connected to the pressure sensor 600 and being arranged at the object chamber 226 provides for the pressure range in the object chamber 226, either the first pressure range or the second pressure range.

The first detector 219, the second detector 228 of the analysis unit 231 and the radiation detector 500 are connected to the control unit 700. The control unit 700 comprises a processor 701 into which a computer program product comprising a program code is loaded, which, when being executed, controls the particle beam device 200 in such a way that a method according to the invention is carried out. This will be explained further below. The control unit 700 also comprises a storage unit 702 and the display unit 703 as mentioned above.

The particle beam device 200 also comprises a plasma cleaning unit 1000 which may be used for cleaning the surface of the object 225, as will be explained further below.

Figure 6:
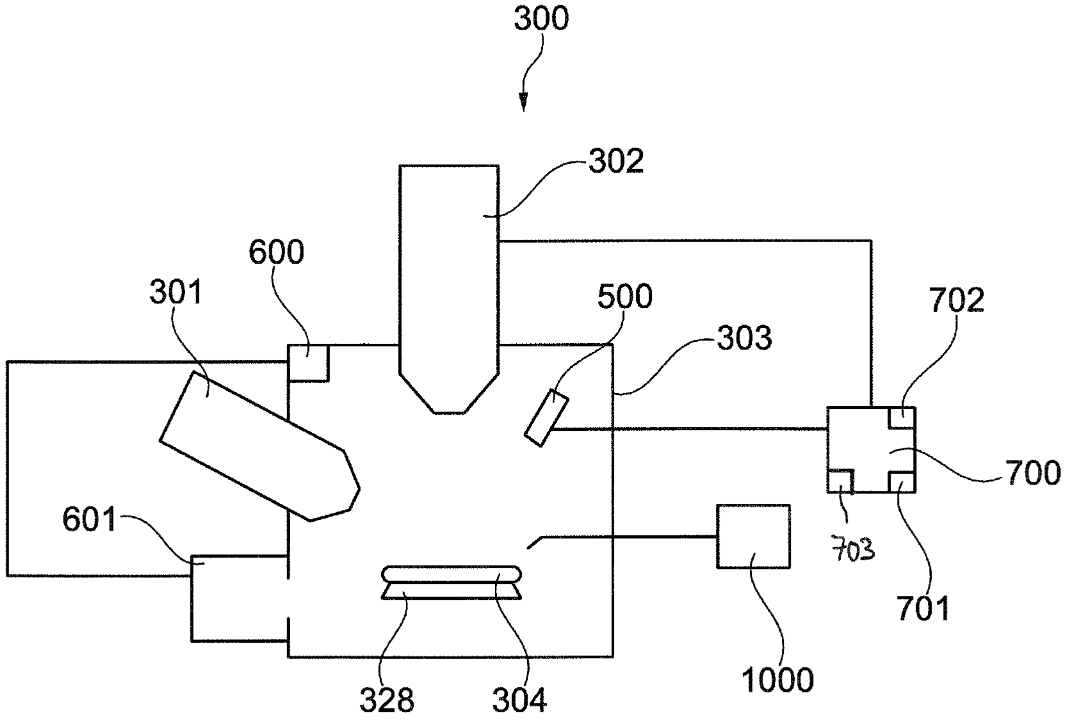
FIG. 6 shows a schematic representation of a fourth embodiment of a particle beam device according to the system described herein.

FIG. 6 shows a schematic illustration of another embodiment of a particle beam device 300 according to the system described herein. The particle beam device 300 has a first particle beam column 301 in the form of an ion beam column, and a second particle beam column 302 in the form of an electron beam column. The first particle beam column 301 and the second particle beam column 302 are arranged on an object chamber 303, in which an object 304 to be analyzed and/or processed is arranged. It is explicitly noted that the system described herein is not restricted to the first particle beam column 301 being in the form of an ion beam column and the second particle beam column 302 being in the form of an electron beam column. In fact, the system described herein also provides for the first particle beam column 301 to be in the form of an electron beam column and for the second particle beam column 302 to be in the form of an ion beam column. A further embodiment of the system described herein provides for both the first particle beam column 301 and the second particle beam column 302 each to be in the form of an ion beam column.

Figure 7:
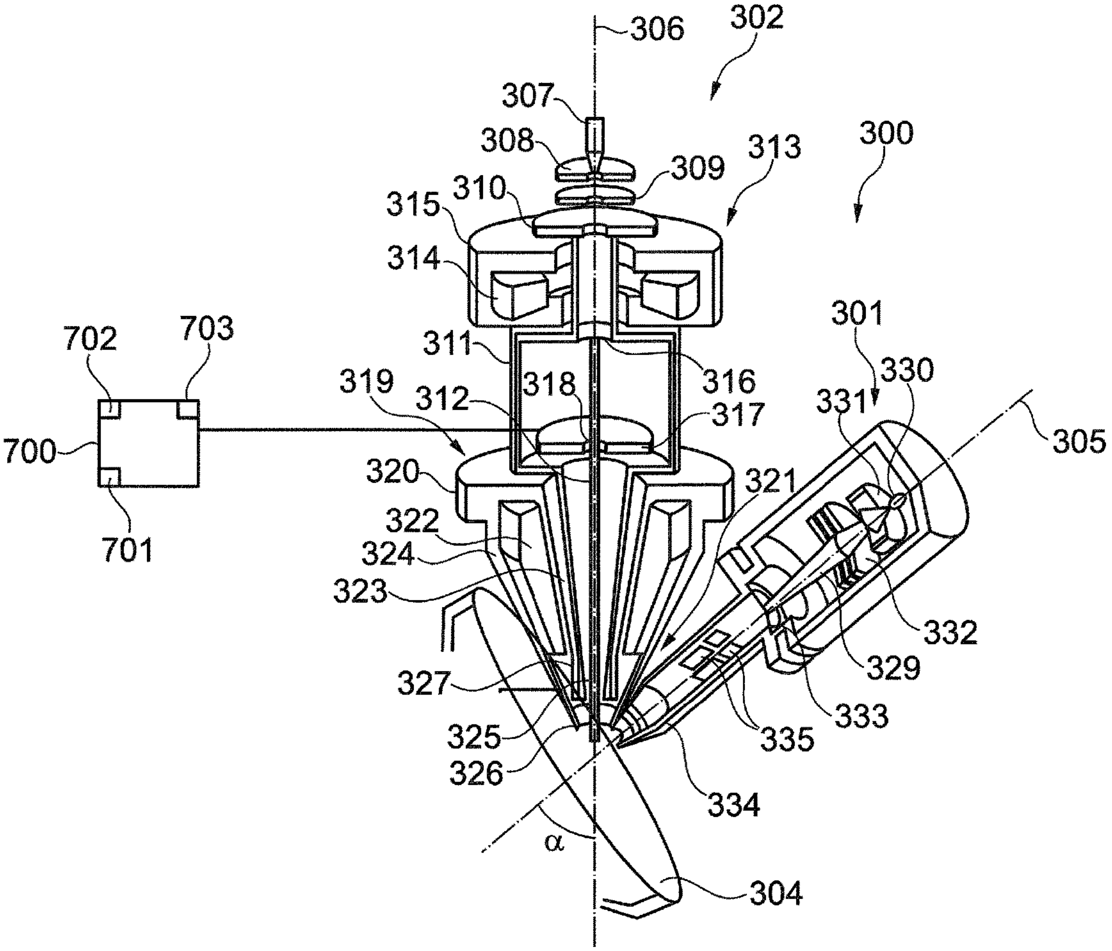
FIG. 7 shows a further schematic representation of the particle beam device according to FIG. 6.

FIG. 7 shows a detailed illustration of the particle beam device 300 shown in FIG. 6. For clarity reasons, the object chamber 303 is not illustrated. The first particle beam column 301 in the form of the ion beam column has a first optical axis 305. Furthermore, the second particle beam column 302 in the form of the electron beam column has a second optical axis 306.

The second particle beam column 302, in the form of the electron beam column, will be described next. The second particle beam column 302 has a second beam generator 307, a first electrode 308, a second electrode 309 and a third electrode 310. By way of example, the second beam generator 307 is a thermal field emitter. The first electrode 308 has the function of a suppressor electrode, while the second electrode 309 has the function of an extractor electrode. The third electrode 310 is an anode, and at the same time forms one end of a beam guide tube 311.

A second particle beam 312 in the form of an electron beam is generated by the second beam generator 307. Electrons which emerge from the second beam generator 307 are accelerated to the anode potential, for example in the range from 1 kV to 30 kV, as a result of a potential difference between the second beam generator 307 and the third electrode 310. The second particle beam 312 in the form of the electron beam passes through the beam guide tube 311, and is focused onto the object 304 to be analyzed and/or processed. This will be described in more detail further below.

The beam guide tube 311 passes through a collimator arrangement 313 which has a first annular coil 314 and a yoke 315. Seen in the direction of the object 304, from the second beam generator 307, the collimator arrangement 313 is followed by a pinhole diaphragm 316 and a detector 317 with a central opening 318 arranged along the second optical axis 306 in the beam guide tube 311.

The beam guide tube 311 then runs through a hole in a second objective lens 319. The second objective lens 319 is used for focusing the second particle beam 312 onto the object 304. For this purpose, the second objective lens 319 has a magnetic lens 320 and an electrostatic lens 321. The magnetic lens 320 is provided with a second annular coil 322, an inner pole piece 323 and an outer pole piece 324. The electrostatic lens 321 comprises an end 325 of the beam guide tube 311 and a terminating electrode 326.

The end 325 of the beam guide tube 311 and the terminating electrode 326 concurrently form an electrostatic deceleration device. The end 325 of the beam guide tube 311, together with the beam guide tube 311, is at the anode potential, while the terminating electrode 326 and the object 304 are at a potential which is lower than the anode potential. This allows the electrons of the second particle beam 312 to be decelerated to a desired energy which is required for examination of the object 304.

The second particle beam column 302 furthermore has a raster device 327, by which the second particle beam 312 can be deflected and can be scanned in the form of a raster over the object 304.

For imaging purposes, the detector 317 which is arranged in the beam guide tube 311 detects secondary electrons and/or backscattered electrons, which result from the interaction between the second particle beam 312 and the object 304. The signals generated by the detector 317 are transmitted to a control unit 700.

Interaction radiation, for example X-rays or cathodoluminescence light, may be detected by using a radiation detector 500, for example a CCD-detector, which is arranged in the object chamber 303 (see FIG. 6). The radiation detector 500 is positioned at the side of the object 304 and is directed to the object 304.

The object 304 is arranged on an object holder 328 in the form of a sample stage as shown in FIG. 6, by which the object 304 is arranged such that it can move along three axes which are arranged to be mutually perpendicular (specifically an x-axis, a y-axis and a z-axis). Furthermore, the sample stage can be rotated about two rotation axes which are arranged to be mutually perpendicular. It is therefore possible to move the object 304 to a desired position. The rotation of the object holder 328 about one of the two rotation axes may be used to tilt the object holder 328 such that the surface of the object 304 may be oriented perpendicular to the second particle beam 312 or to the first particle beam 329. Alternatively, the surface of the object 304 may be oriented in such a way that the surface of the object 304 on one hand and the first particle beam 329 or the second particle beam 312 on the other hand are at an angle, for example in the range of 0° to 90°.

As mentioned previously, reference symbol 301 denotes the first particle beam column, in the form of the ion beam column. The first particle beam column 301 has a first beam generator 330 in the form of an ion source. The first beam generator 330 is used for generating the first particle beam 329 in the form of an ion beam. Furthermore, the first particle beam column 301 is provided with an extraction electrode 331 and a collimator 332. The collimator 332 is followed by a variable aperture 333 in the direction of the object 304 along the first optical axis 305. The first particle beam 329 is focused onto the object 304 by a first objective lens 334 in the form of focusing lenses. Raster electrodes 335 are provided, in order to scan the first particle beam 329 over the object 304 in the form of a raster.

When the first particle beam 329 strikes the object 304, the first particle beam 329 interacts with the material of the object 304. In the process, interaction radiation is generated and detected using the radiation detector 500. Interaction particles are generated, in particular secondary electrons and/or secondary ions. These are detected using the detector 317.

The object chamber 303 is operated in a first pressure range or in a second pressure range, wherein the first pressure range only comprises pressures lower than or equal to $10^{-3}$ hPa and wherein the second pressure range only comprises pressures equal to or over $10^{-3}$ hPa. A pressure sensor 600 is arranged in the object chamber 303 for measuring the pressure in the object chamber 303 (see FIG. 6). A pump system 601 being connected to the pressure sensor 600 and arranged at the object chamber 303 provides for the pressure range in the object chamber 303, either the first pressure range or the second pressure range.

The first particle beam 329 may also be used to process the object 304. For example, material may be deposited on the surface of the object 304 using the first particle beam 329, wherein the material is provided with a gas injection system (GIS). Additionally or alternatively, structures may be etched into the object 304 using the first particle beam 329. Moreover, the second particle beam 312 may be used to process the object 304, for example by electron beam induced deposition. The detector 317 and the radiation detector 500 are connected to the control unit 700 as shown in FIGS. 6 and 7. The control unit 700 comprises a processor 701 into which a computer program product comprising a program code is loaded, which, when being executed, controls the particle beam device 300 in such a way that a method according to the system described herein is carried out. This will be explained further below. The control unit 700 also comprises a storage unit 702 and a display unit 703.

The particle beam device 300 also comprises a plasma cleaning unit 1000 which may be used for cleaning the surface of the object 304, as will be explained further below.

Figure 8A:
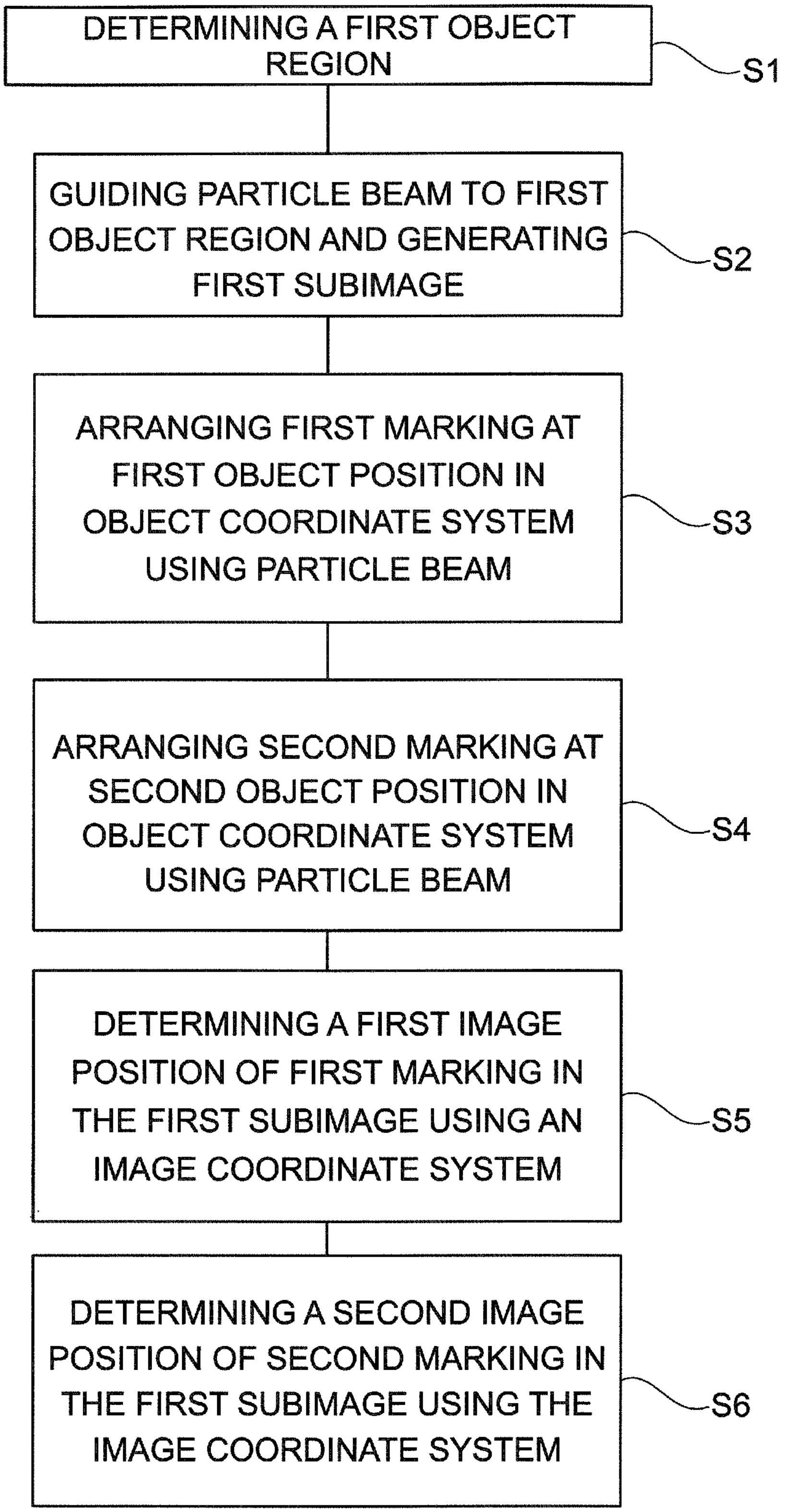
FIG. 8A, 8B show a flow chart of a first embodiment of a method according to the system described herein.
Figure 8B:
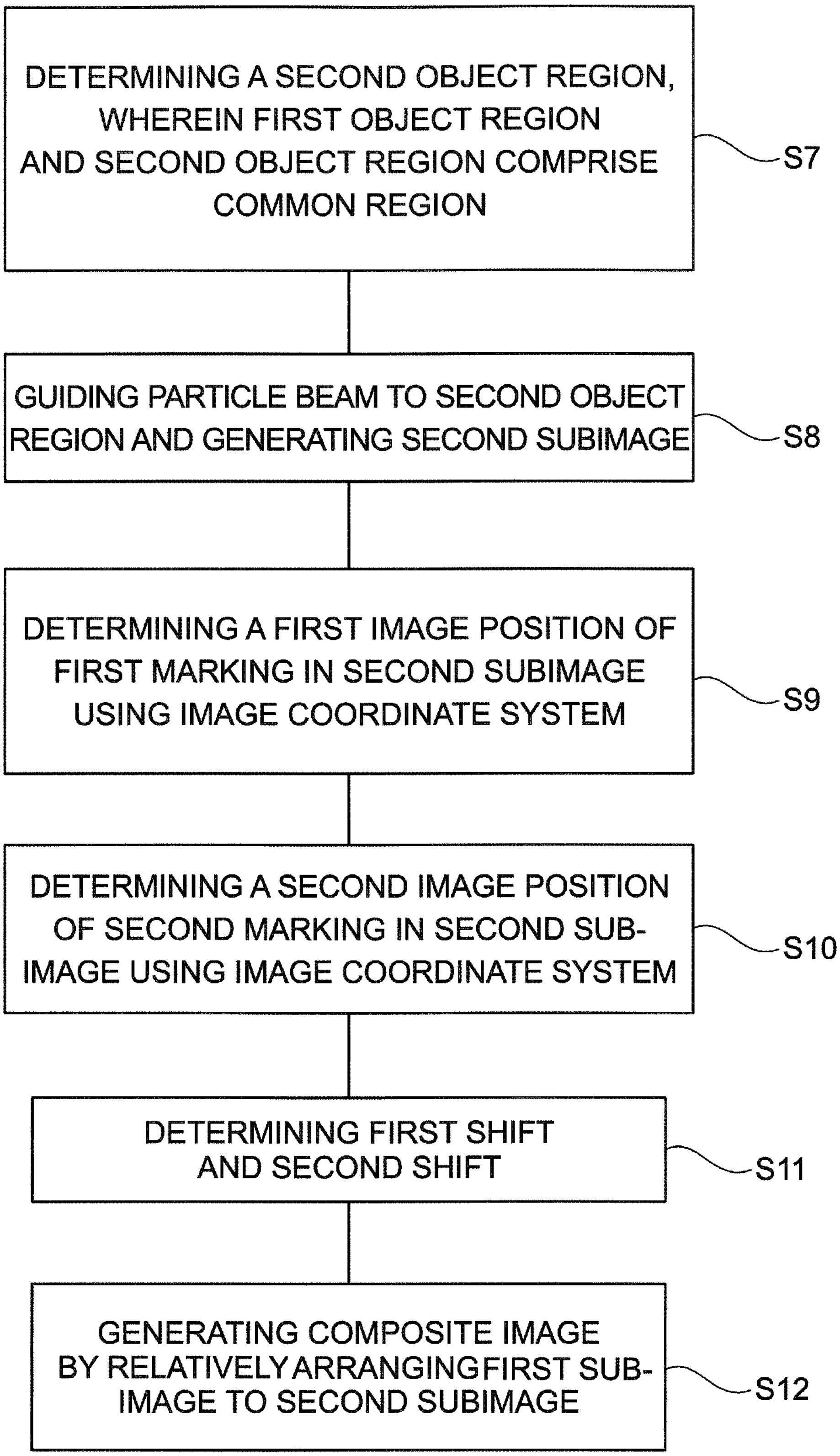

FIGS. 8A and 8B show a first embodiment of the method according to the system described herein. The embodiment of the method according to the system described herein shown in FIGS. 8A and 8B is carried out using the SEM 100 according to FIG. 4. It is noted that the method may also be carried out with other particle beam devices, in particular the SEM 100 of FIG. 4A, the particle beam device 200 of FIG. 5 and the particle beam device 300 of FIGS. 6 and 7.

Figure 9:
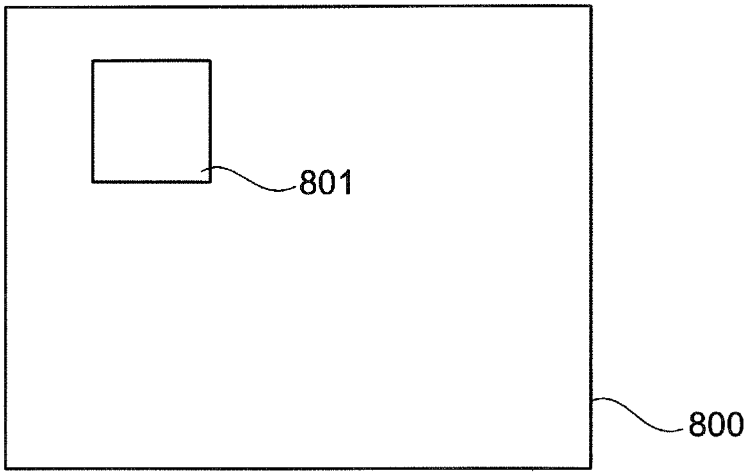
FIG. 9 shows a schematic view of an object to be imaged according to the system described herein.

Hereinafter, the object to be imaged is denoted with reference sign 800. The object 800 is shown in a schematic view in FIG. 9. A composite image of the object 800 is generated by stitching sub images of the object 800 together using the method according to the system described herein. A first object region 801 of the object 800 is determined in method step S1. FIG. 9 shows a schematic view of the first object region 801. The first object region 801 is part of the surface of the object 800.

Figure 10:
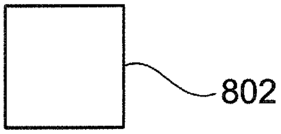
FIG. 10 shows a schematic view of a first sub image of a first object region according to the system described herein.

In method step S2, the particle beam in the form of the electron beam of the SEM 100 is guided to the first object region 801 and over the object region 801 in a raster form. Interaction particles and/or interaction radiation result from the interaction of the particle beam with the object 800. The interaction particles are in particular secondary electrons and/or backscattered electrons. The interaction particles are detected using the first detector 116 and/or the second detector 117. The first detector 116 and/or the second detector 117 generate a detection signal which is used for generating a first sub image of the first object region 801. The first sub image is schematically shown in FIG. 10 and is denoted with the reference sign 802. The first sub image 802 may be stored in the storage unit 702 of the control unit 700.

The interaction radiation may be X-rays or cathodoluminescence light. The interaction radiation may be detected using the radiation detector 500. The radiation detector 500 may generate a detection signal which may be also used to generate a first sub image which may be stored in the storage unit 702 of the control unit 700.

Figure 11:
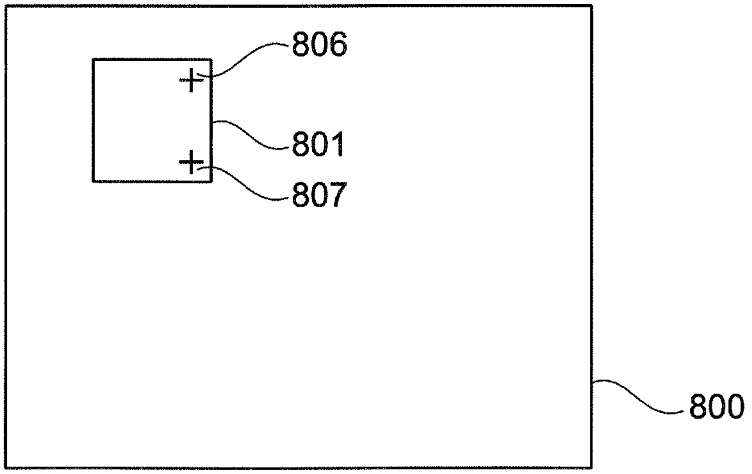
FIG. 11 shows a schematic view of the object having the first object region comprising a first marking and a second marking according to the system described herein.

In a further method step S3, a first marking is arranged in the first object region 801 at a first object position in an object coordinate system. The object coordinate system is the coordinate system of the object 800. The particle beam in the form of the electron beam is used for arranging the first marking at the first object position. For example, an electron beam induced deposition of carbon may be used for arranging the first marking at the first object position. For example, a few nanometers of carbon are deposited on the object 800 as the first marking. Additionally, in method step S4, a second marking is arranged in the first object region 801 at a second object position in the object coordinate system. The particle beam in the form of the electron beam is also used for arranging the second marking at the second object position. Again, for example, an electron beam induced deposition of carbon may be used for arranging the second marking at the second object position. For example, a few nanometers of carbon are deposited on the object 800 as the second marking. FIG. 11 shows a schematic view of the first object region 801, now being marked with the first marking 806 and the second marking 807. The first marking 806 and the second marking 807 are distinct features which are unique and may be easily identified.

Figure 12:
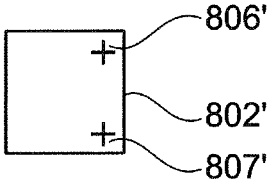
FIG. 12 shows a schematic view of a calculated model of a first sub image of the first object region according to the system described herein.

In method step S5, the first image position of the first marking 806 in the first sub image 802 is determined using an image coordinate system by using mathematical methods. Therefore, the first image position of the first marking 806 is calculated. The image coordinate system is the coordinate system of the sub image 802. The first image position in the image coordinate system corresponds to the first object position in the object coordinate system. Additionally, in method step S6, a second image position of the second marking 807 in the first sub image 802 is determined using the image coordinate system by using mathematical methods. Therefore, the second image position of the second marking 807 is calculated. The second image position in the image coordinate system corresponds to the second object position in the object coordinate system. The step of determining the first image position of the first marking 806 in the first sub image 802 and the step of determining the second image position of the second marking 807 in the first sub image 802 does not mean that the sub image 802 actually shows the first marking 806 and the second marking 807 since the first marking 806 and the second marking 807 have been arranged in the first object region 801 after the first sub image 802 was generated. Instead, it is determined—using mathematical methods and calculations—at which positions the first marking 806 and the second marking 807 would have been shown in the first sub image 802 if the first sub image 802 would have been generated after having arranged the first marking 806 and the second marking 807 in the first object region 801. FIG. 12 shows a calculated model 802' of the first sub image 802, having the calculated first marking 806' at the first image position and the calculated second marking 807' at the second image position.

Figure 13:
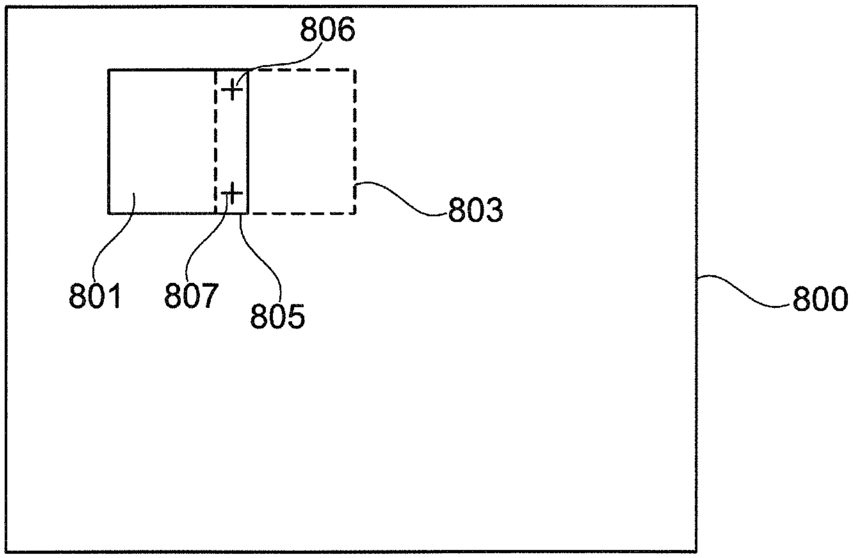
FIG. 13 shows a further schematic view of the object to be imaged according to the system described herein.

The embodiment of the method according to the system described herein also comprises the method step S7. In method step S7, a second object region 803 of the object 800 to be imaged is determined. The second object region 803 is a part of the surface of the object 800. The second object region 803 of the object 800 is schematically shown in FIG. 13. The second object region 803 is determined in such a way that the first object region 801 and the second object region 803 comprise a common region 805. The common region 805 being part of the first object region 801 and being part of the second object region 803 comprises the first marking 806 and the second marking 807.

Figure 14:
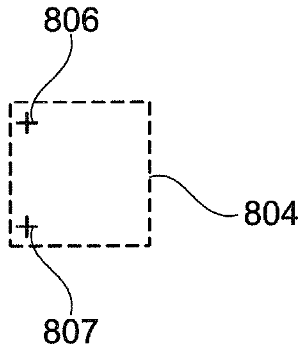
FIG. 14 shows a schematic view of a second sub image of a second object region according to the system described herein.

In method step S8, the particle beam in the form of the electron beam is guided to the second object region 803 and over the second object region 803 in a raster form. Again, interaction particles result from the interaction of the particle beam with the object 800. The interaction particles are in particular secondary electrons and/or backscattered electrons. The interaction particles are detected using the first detector 116 and/or the second detector 117. The first detector 116 and/or the second detector 117 generate a detection signal which is used for generating a second sub image of the second object region 803. The second sub image is schematically shown in FIG. 14 and is denoted with the reference sign 804. The second sub image 804 may be stored in the storage unit 702 of the control unit 700. The common region 805 which is also shown in the second sub image 804 comprises the first marking 806 and the second marking 807. However, the common region 805 being shown in the first sub image 802 does not show the first marking 806 and the second marking 807 since the first marking 806 and the second marking 807 have been arranged on the object 800 after the first sub image 802 was generated.

The interaction radiation may be detected using the radiation detector 500. The radiation detector 500 may generate a detection signal which may be also used to generate a second sub image which may be stored in the storage unit 702 of the control unit 700.

The embodiment of the method according to the system described herein also comprises method step S9. A first image position of the first marking 806 in the second sub image 804 using the image coordinate system is determined. Moreover, in method step S10, a second image position of the second marking 807 in the second sub image 804 is determined using the image coordinate system. The first image position and the second image position may be stored in the storage unit 702 of the control unit 700.

In method step S11, a first shift of the calculated first image position of the calculated first marking 806' in the first sub image 802 to the first image position of the first marking 806 in the second sub image 804 is determined. Moreover, a second shift of the calculated second image position of the calculated second marking 807' in the first sub image 802 to the second image position of the second marking 807 in the second sub image 804 is determined. The first shift and/or the second shift comprise(s) information about the distance between the first sub image 802 and the second sub image 804 as well as the direction into which the first sub image 802 should be relatively arranged to the second sub image 804 to generate a composite image.

Figure 15:
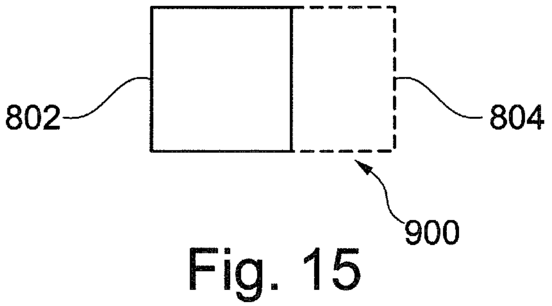
FIG. 15 shows a schematic view of a composite image of the object according to the system described herein.

In method step S12, the composite image 900 is generated and is shown on the display unit 703 after generation of the composite image 900. The composite image 900 is schematically shown in FIG. 15. The first sub image 802 is relatively arranged to the second sub image 804 by using the first shift and/or the second shift and by using the calculated first sub image 802' first. As mentioned above, the first shift and/or the second shift comprise(s) information about the distance between the first sub image 802 and the second sub image 804 as well as the direction into which the first sub image 802 is relatively arranged to the second sub image 804 to generate the composite image 900 by stitching the first sub image 802 and the second sub image 804 together. When generating the composite image 900, the calculated first sub image 802' is relatively moved to the second sub image 804 in such a way that the calculated first marking 806' of the calculated first sub image 802' is arranged on the first image position of the first marking 806 of the second sub image 804. In other words, the calculated first image position of the calculated first marking 806' is arranged on the first image position of the first marking 806 in the second sub image 804. Moreover, the calculated first sub image 802' is relatively moved to the second sub image 804 in such a way that the calculated second marking 807' of the calculated first sub image 802' is arranged on the second image position of the second marking 807 of the second sub image 804. In other words, the calculated second image position of the calculated second marking 807' is arranged on the second image position of the second marking 807 in the second sub image 804.

Additionally, the calculated first sub image 802' is also relatively arranged to the second sub image 804 in such a way that the calculated first sub image 802' overlaps the second sub image 804 in the entire common region 805. When the calculated first sub image 802' is relatively arranged to the second sub image 804, instead of using the calculated first sub image 802', the first sub image 802, which does not show the first marking 806 and the second marking 807, is now used. Therefore, the first sub image 802 and the second sub image 804 are stitched together to the composite image 900. The composite image 900 does not show the first marking 806 and the second marking 807 since the first sub image 802 overlaps the second sub image 804 in such a way that the first marking 806 and the second marking 807 are not shown in the composite image 900.

The above mentioned method steps may be repeated such that a third sub image is stitched together to the second sub image 804 and so on.

The method according to the system described herein is based on the idea to generate distinctive features, in particular the first marking 806 and the second marking 807. The distinctive features may be used as alignment features on demand. The invention is not restricted using two markings. Instead any suitable numbers of markings may be used, for example 3 to 10. As explained above, the first marking 806 and the second marking 807 are not shown in the first sub image 802. When relatively arranging the first sub image 802 and the second sub image 804 to each other, the first sub image 802 may overlap the second sub image 804 in such a way that the first marking 806 and the second marking 807 are not shown in the composite image 900, although the first marking 806 and the second marking 807 were arranged on the object 800.

The first marking 806 and the second marking 807 may be designed to facilitate an automatic alignment process such that the image stitching process may be performed with high reliability independent of the features arranged on the surface of the object 800. Moreover, there is a potential low computation time to achieve the step of relatively arranging the first sub image 802 to the second sub image 804 since a low number of correlations are to be calculated, in particular the calculated first image position of the calculated first marking 806' in the calculated first sub image 802' to the first image position of the first marking 806 in the second sub image 804 and the calculated second image position of the calculated second marking 807' in the calculated first sub image 802' to the second image position of the second marking 807 in the second sub image 804.

Figure 16A:
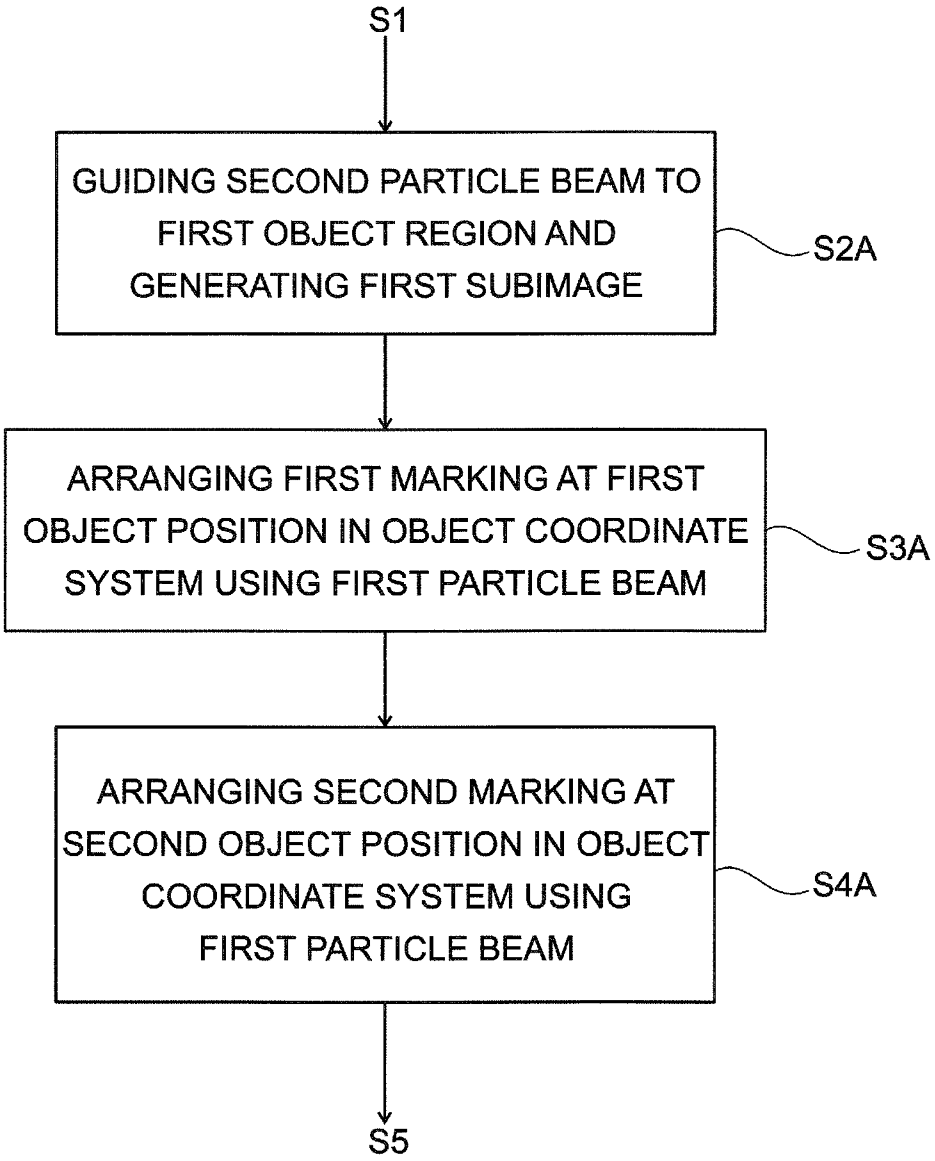
FIG. 16A, 16B show a flow chart of a few steps of a second embodiment of a method according to the system described herein.
Figure 16B:
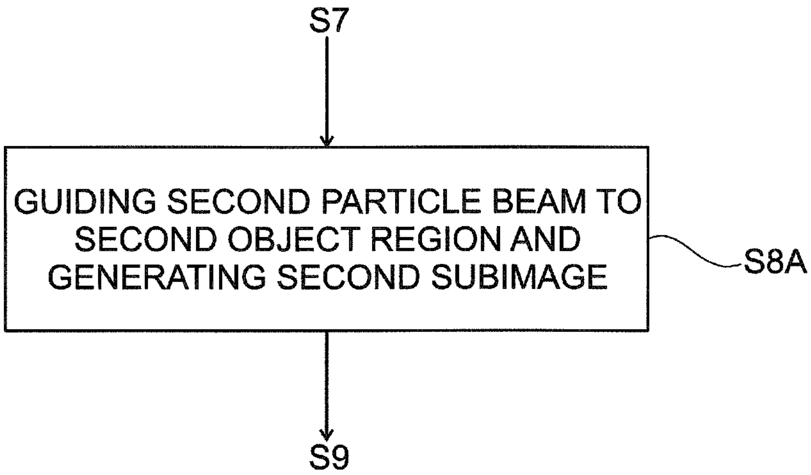

FIGS. 16A and 16B show a few steps of a second embodiment of the method according to the system described herein. This embodiment of the method according to the system described herein shown in FIGS. 16A and 16B is carried out using the particle beam device 300 of FIGS. 6 and 7. The second embodiment of the method according to the system described herein shown in FIGS. 16A and 16B is based on the embodiment of the method according to the system described herein shown in FIGS. 8A and 8B. Therefore, it is referred to the above mentioned. The second embodiment of the method according to the system described herein shown in FIGS. 16A and 16B comprises method steps S2A to S4A instead of method steps S2 to S4. In method step S2A, the second particle beam 312 in the form of the electron beam is guided to the first object region 801 and is guided over the object region 801 in a raster form. Interaction particles result from the interaction of the second particle beam with the object 800. The interaction particles are in particular secondary electrons and/or backscattered electrons, and they are detected using the detector 317. The detector 317 generates a detection signal which is used for generating the first sub image 802 of the first object region 801. In a further method step S3A, a first marking is arranged in the first object region 801 at a first object position in an object coordinate system. The object coordinate system is the coordinate system of the object 800. The first particle beam 329 in the form of the ion beam is used for arranging the first marking at the first object position. Additionally, in method step S4A, a second marking is arranged in the first object region 801 at a second object position in the object coordinate system. The second particle beam 329 in the form of the ion beam is also used for arranging the second marking at the second object position.

The second embodiment of the method according to the system described herein shown in FIGS. 16A and 16B comprises method step S8A instead of method step S8. In method step S8A, the second particle beam 312 in the form of the electron beam is guided to the second object region 803 and over the second object region 803 in a raster form. Again, interaction particles result from the interaction of the second particle beam with the object 800. The interaction particles are in particular secondary electrons and/or backscattered electrons. They are detected using the detector 317. The detector 317 generates a detection signal which is used for generating the second sub image 804 of the second object region 803.

Figure 17:
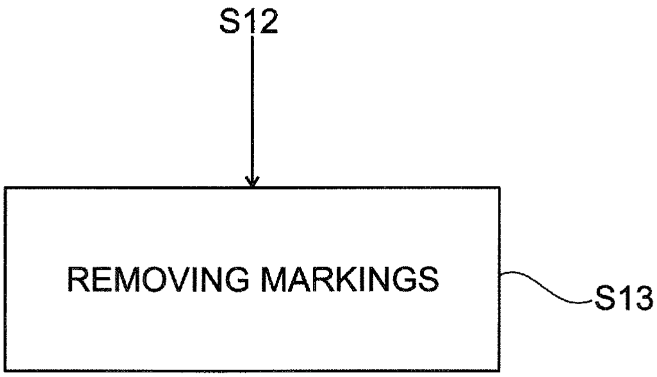
FIG. 17 shows a further step of a third embodiment of the method according to the system described herein.

A third embodiment of the method according to the system described herein comprises a further method step, namely method step S13 which is carried out after method step S12 and which is shown in FIG. 17. As mentioned above, the first marking 806 may be removable from the first object region 801 and/or the second marking 807 may be removable from the first object region 801. For example, the first marking 806 and/or the second marking 807 is/are generated by using an electron beam induced deposition (EBID) of carbon on the object 300. For example, a few nanometers of carbon are deposited on the object 300 as the first marking 806 and/or as the second marking 807. Such a few nanometers of carbon are sufficient to deliver a distinguished contrast in the first sub image 802 and in the second sub image 804. The deposited carbon may be removed, for example by using the plasma cleaning unit 1000 without damaging the object 800. Additionally or alternatively, the first marking 806 and/or the second marking 807 may be removed by using the first particle beam in the form of the ion beam of the particle beam device 300 shown in FIGS. 6 and 7.

Figure 18:
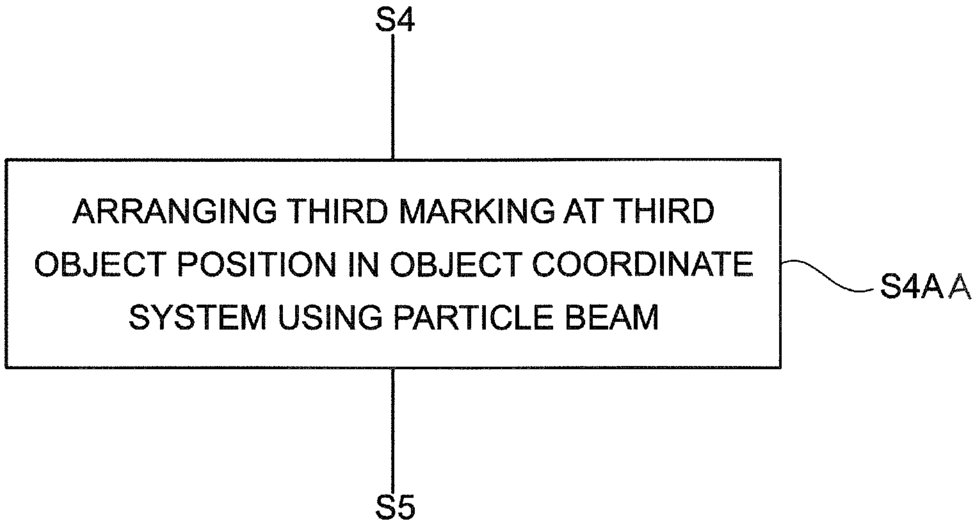
FIG. 18 shows a further step of a fourth embodiment of the method according to the system described herein.
Figure 19:
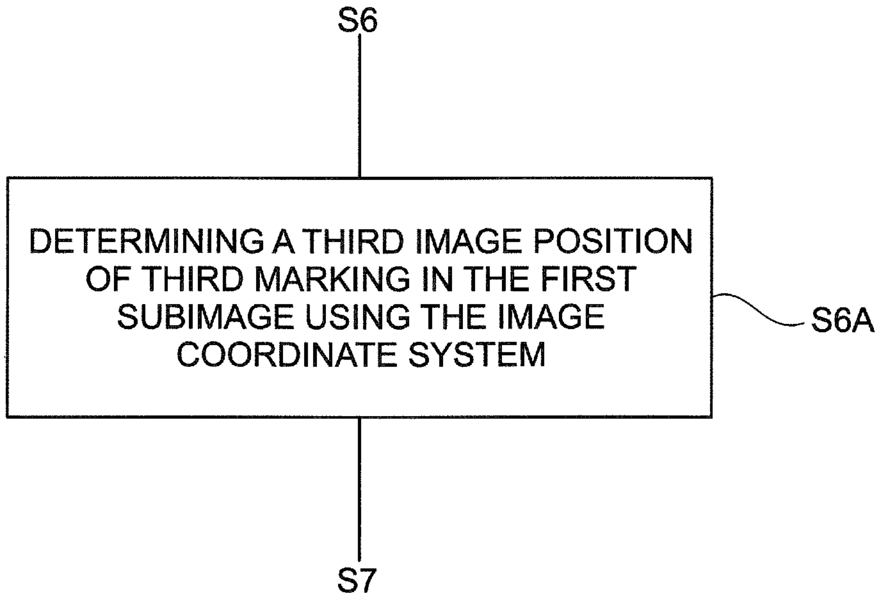
FIG. 19 shows a further step of the fourth embodiment of the method according to the system described herein.
Figure 20:
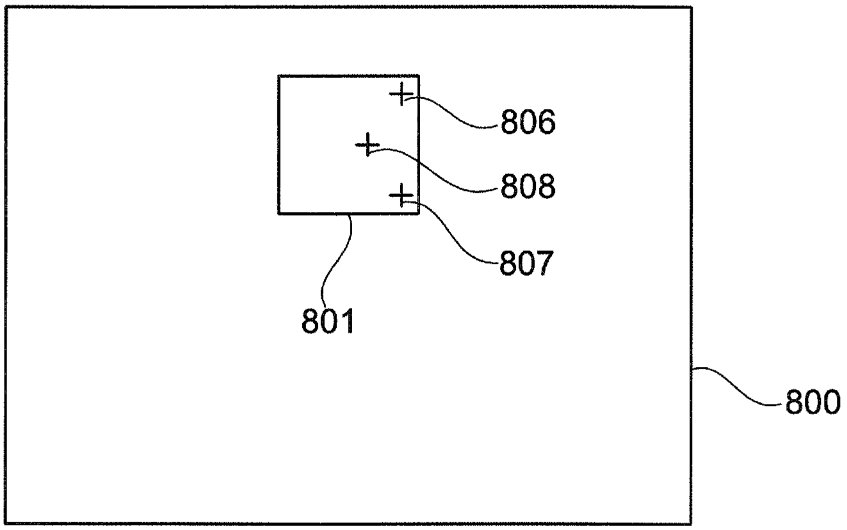
FIG. 20 shows a further schematic view of the object having a first object region comprising a first marking, a second marking and a third marking according to the system described herein.

A fourth embodiment of the method according to the system described herein comprises further method steps, as shown in FIGS. 18 and 19. This embodiment is based on the embodiment shown in FIGS. 8A and 8B. A further step is carried out between method step S4 and method step S5, namely method step S4AA. Additionally to the first marking 806 and to the second marking 807, a third marking 808 is arranged in the first object region 801 at a third object position in the object coordinate system. The particle beam in the form of the electron beam is also used for arranging the third marking 808 at the third object position. Again, for example, an electron beam induced deposition of carbon may be used for arranging the third marking 808 at the third object position. For example, a few nanometers of carbon are deposited on the object 800 as the third marking 808. FIG. 20 shows a schematic view of the first object region 801, now being marked with the first marking 806, the second marking 807 and the third marking 808. The first marking 806, the second marking 807 and the third marking 808 are distinct features which are unique and may be easily identified. The first marking 806 and the second marking 807 are arranged on an imaginary straight line. The third marking 808 is arranged in a distance to the imaginary straight line.

Figure 21:
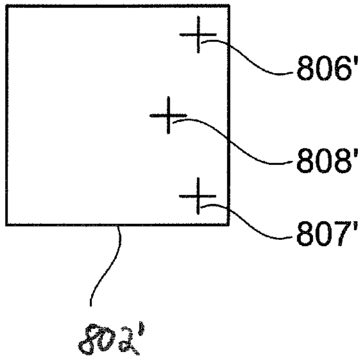
FIG. 21 shows a further schematic view of a calculated model of a first sub image of the first object region according to the system described herein.

The further embodiment also comprises a further step which is carried out between method step S6 and method step S7, namely method step S6A. In method step S6A, the third image position of the third marking 808 in the first sub image 802 is determined using the image coordinate system by using mathematical methods. Therefore, the third image position of the third marking 808 is calculated. The third image position in the image coordinate system corresponds to the third object position in the object coordinate system. The step of determining the third image position of the third marking 808 in the first sub image 802 does not mean that the sub image 802 actually shows the third marking 808 since the first marking 806, the second marking 807 and the third marking 808 have been arranged in the first object region 801 after the first sub image 802 was generated. Rather, it is determined—using mathematical methods and calculations—at which positions the first marking 806, the second marking 807 and the third marking 808 would have been shown in the first sub image 802 if the first sub image 802 would have been generated after having arranged the first marking 806, the second marking 807 and the third marking 808 in the first object region 801. FIG. 21 shows a calculated model 802' of the first sub image 802, having the calculated first marking 806' at the first image position, the calculated second marking 807' at the second image position and the calculated third marking 808' at the third image position.

Figure 22:
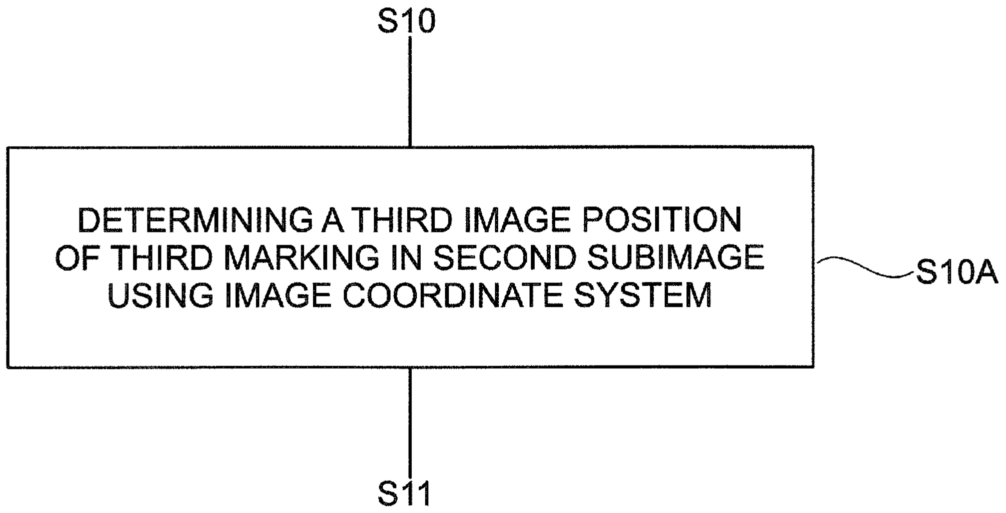
FIG. 22 shows a further step of the fourth embodiment of the method according to the system described herein.

The further embodiment also comprises a further step which is carried out between method step S10 and method step S11, namely method step S10A as shown in FIG. 22. In method step S10A, a third image position of the third marking 808 in the second sub image 804 using the image coordinate system is determined. As mentioned above, the first image position and the second image position may be stored in the storage unit 702 of the control unit 700. Additionally, the third image position may also be stored in the storage unit 702 of the control unit 700.

Figure 23:
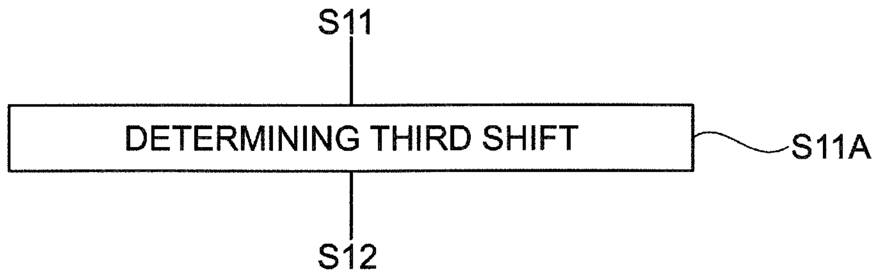
FIG. 23 shows a further step of the fourth embodiment of the method according to the system described herein.

The further embodiment also comprises a further step which is carried out between method step S11 and method step S12, namely method step S11A as shown in FIG. 23. In method step S11A, a third shift of the calculated third image position of the calculated third marking 808' in the calculated first sub image 802' to the third image position of the third marking 808 in the second sub image 804 is determined. The third shift comprises information about the distance between the first sub image 802 and the second sub image 804 as well as the direction into which the first sub image 802 should be relatively arranged to the second sub image 804 to generate a composite image.

The further embodiment also comprises method step S12. In method step S12, the composite image 900 is generated and is shown on the display unit 703. The first sub image 802 is relatively arranged to the second sub image 804 by using the first shift, the second shift and/or the third shift, and by using the calculated first sub image 802' first. As mentioned above, the first shift, the second shift and/or the third shift comprise(s) information about the distance between the first sub image 802 and the second sub image 804 as well as the direction—and/or, for example, a rotation or an inversion—into which the first sub image 802 is relatively arranged to the second sub image 804 to generate the composition image 900 by stitching the first sub image 802 and the second sub image 804 together. When generating the composite image 900, the calculated first sub image 802' is relatively moved to the second sub image 804 in such a way that the calculated first marking 806' of the calculated first sub image 802' is arranged on the first image position of the first marking 806 of the second sub image 804. In other words, the calculated first image position of the calculated first marking 806' is arranged on the first image position of the first marking 806 in the second sub image 804. Moreover, the calculated first sub image 802' is relatively moved to the second sub image 804 in such a way that the calculated second marking 807' of the calculated first sub image 802' is arranged on the second image position of the second marking 807 of the second sub image 804. In other words, the calculated second image position of the calculated second marking 807' is arranged on the second image position of the second marking 807 in the second sub image 804.

Additionally, the calculated first sub image 802' is relatively moved to the second sub image 804 in such a way that the calculated third marking 808' of the calculated first sub image 802' is arranged on the third image position of the third marking 808 of the second sub image 804. In other words, the calculated third image position of the calculated third marking 808' is arranged on the third image position of the third marking 808 in the second sub image 804.

Additionally, the calculated first sub image 802' is also relatively arranged to the second sub image 804 in such a way that the calculated first sub image 802' overlaps the second sub image 804 in the entire common region 805. When the calculated first sub image 802' is relatively arranged to the second sub image 804, instead of using the calculated first sub image 802', the first sub image 802, which does not show the first marking 806, the second marking 807 and the third marking 808, is now used. Therefore, the first sub image 802 and the second sub image 804 are stitched together to the composite image 900. The composite image 900 does not show the first marking 806, the second marking 807 and the third marking 808 since the first sub image 802 overlaps the second sub image 804 in such a way that the first marking 806, the second marking 807 and the third marking 808 are not shown in the composite image 900.

The first marking 806, the second marking 807 and/or the third marking 808 may have any suitable design. In particular, the first marking 806, the second marking 807 and/or the third marking 808 may be a hole, a recess, an elevation and/or a coating. Moreover, the first marking 806, the second marking 807 and/or the third marking 808 may be shaped differently or designed differently. For example, the first marking 806 may be a hole, whereas the second marking 807 may be a coating and whereas the third marking 808 may be a recess. We also refer to the explanations with respect to the designs of the markings as mentioned above which also apply to the markings of the embodiments.

Various embodiments discussed herein may be combined with each other in appropriate combinations in connection with the system described herein. Additionally, in some instances, the order of steps in the flow diagrams, flowcharts and/or described flow processing may be modified, where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SO card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the invention will be apparent to those skilled in the art from a consideration of the specification and/or an attempt to put into practice the invention disclosed herein. It is intended that the specification and examples be considered as exemplary only, with the true scope and spirit of the invention being indicated by the following claims.

What is claimed is:

1. A method for generating a composite image of an object from a particle beam device, the method comprising:
- generating a particle beam of charged particles from a particle generator;
- focusing the particle beam onto the object with an objective lens;
- determining a first object region of the object;
- guiding the particle beam to the first object region;
- generating a first sub image of the first object region, wherein generating the first sub image includes detecting first interaction particles and/or first interaction radiation with a detection unit, wherein the first interaction particles and the first interaction radiation arise from an interaction of the particle beam with the object when the particle beam impinges on the object;
- arranging at least a first marking in the first object region at a first object position in an object coordinate system, and arranging at least a second marking in the first object region at a second object position in the object coordinate system;
- calculating a first image position of the first marking in the first sub image in an image coordinate system, the first image position corresponding to the first object position in the object coordinate system;
- calculating a second image position of the second marking in the first sub image in the image coordinate system, the second image position corresponding to the second object position in the object coordinate system;
- determining a second object region of the object, the second object region comprising a common region with the first object region, wherein the common region comprises the first marking and the second marking;
- guiding the particle beam to the second object region;
- generating a second sub image of the second object region, wherein generating the second sub image includes detecting second interaction particles and/or second interaction radiation with the detection unit, wherein the second interaction particles and the second interaction radiation arise from an interaction of the particle beam with the object when the particle beam impinges on the object;
- determining a first image position of the first marking in the second sub image in the image coordinate system and determining a second image position of the second marking in the second sub image in the image coordinate system; and
- generating the composite image by relatively arranging the first sub image to the second sub image such that the first sub image overlaps the second sub image in the entire common region, the calculated first image position of the first marking in the first sub image is arranged on the first image position of the first marking in the second sub image, and the calculated second image position of the second marking in the first sub image is arranged on the second image position of the second marking in the second sub image,
- wherein the method comprises generating only two images of regions of the object, the first sub image and the second sub image, the first sub image not including a marking.

2. The method according to claim 1, wherein a first shift of the calculated first image position of the first marking in the first sub image to the first image position of the first marking in the second sub image is determined, a second shift of the calculated second image position of the second marking in the first sub image to the second image position of the second marking in the second sub image is determined, and wherein the step of arranging the first sub image to the second sub image includes applying the first shift and/or the second shift.

3. The method according to claim 1, wherein arranging the first marking in the first object region at the first object position includes applying the particle beam and/or arranging the second marking in the first object region at the second object position includes applying the particle beam.

4. The method according to claim 1, wherein the first marking is removable from the first object region and/or the second marking is removable from the first object region.

5. The method according to claim 1, wherein the particle generator is a first particle generator for generating a first particle beam of first charged particles, wherein the objective lens is a first objective lens for focusing the first particle beam onto the object, wherein the particle beam device further comprises a second particle generator for generating a second particle beam of second charged particles, and wherein the particle beam device also comprises a second objective lens for focusing the second particle beam onto the object, the method further comprising at least one of the following features:
- generating the first sub image of the first object region includes applying the first particle beam;
- generating the second sub image of the second object region includes applying the first particle beam;
- arranging the first marking in the first object region at the first object position includes applying the second particle beam; and
- arranging the second marking in the first object region at the second object position includes applying the second particle beam.

6. The method according to claim 5, wherein the method comprises at least one of the following features:
- removing the first marking from the first object region;
- removing the first marking from the first object region, including applying the first particle beam and/or the second particle beam;
- removing the first marking from the first object region, including applying a plasma;
- removing the second marking from the first object region;
- removing the second marking from the first object region, including applying the first particle beam and/or the second particle beam; and
- removing the second marking from the first object region, including applying a plasma.

7. The method according to claim 1, wherein the method comprises at least one of the following features:
removing the first marking from the first object region;
removing the first marking from the first object region, including applying the particle beam;
removing the first marking from the first object region, including applying a plasma;
removing the second marking from the first object region;
removing the second marking from the first object region, including applying the particle beam; and
removing the second marking from the first object region, including applying a plasma.

8. The method according to claim 1, further comprising:
generating a calculated model of the first sub image by introducing the calculated first image position of the first marking and the calculated second image position of the second marking into the first sub image and arranging the first sub image relatively to the second sub image includes applying the calculated model of the first sub image.

9. The method according claim 1, further comprising:
arranging at least a third marking in the first object region at a third object position in the object coordinate system;
calculating a third image position of the third marking in the first sub image in the image coordinate system, the third image position corresponding to the third object position in the object coordinate system, wherein the common region comprises the third marking; and
determining a third image position of the third marking in the second sub image in the image coordinate system,
wherein the composite image is generated by relatively arranging the first sub image to the second sub image such that the calculated third image position of the third marking in the first sub image is arranged on the third image position of the third marking in the second sub image.

10. The method according to claim 9, further comprising:
arranging the first marking, the second marking and the third marking in the first object region in such a way that two markings of the group comprising the first marking, the second marking and the third marking are arranged on an imaginary straight line and that the remaining marking of the group of the first marking, the second marking and the third marking is arranged in a distance to the imaginary straight line.

11. The method of claim 1, wherein the first sub image is an only image generated specifically for the first object region.

12. A computer program product comprising one or more computer-readable media having program code stored thereon for execution by one or more processors, the program code defining a method of controlling a particle beam device to generate a composite image by:
determining a first object region of an object;
guiding a particle beam of the particle beam device to the first object region;
generating a first sub image of the first object region, wherein generating the first sub image includes detecting first interaction particles and/or first interaction radiation with a detection unit, wherein the first interaction particles and the first interaction radiation arise from an interaction of the particle beam with the object when the particle beam impinges on the object;
arranging at least a first marking in the first object region at a first object position in an object coordinate system, and arranging at least a second marking in the first object region at a second object position in the object coordinate system;
calculating a first image position of the first marking in the first sub image in an image coordinate system, the first image position corresponding to the first object position in the object coordinate system;
calculating a second image position of the second marking in the first sub image in the image coordinate system, the second image position corresponding to the second object position in the object coordinate system;
determining a second object region of the object, the second object region comprising a common region with the first object region, wherein the common region comprises the first marking and the second marking;
guiding the particle beam to the second object region;
generating a second sub image of the second object region, wherein generating the second sub image includes detecting second interaction particles and/or second interaction radiation with the detection unit, wherein the second interaction particles and the second interaction radiation arise from an interaction of the particle beam with the object when the particle beam impinges on the object;
determining a first image position of the first marking in the second sub image in the image coordinate system and determining a second image position of the second marking in the second sub image in the image coordinate system; and
generating the composite image by relatively arranging the first sub image to the second sub image such that the first sub image overlaps the second sub image in the entire common region, the calculated first image position of the first marking in the first sub image is arranged on the first image position of the first marking in the second sub image, and the calculated second image position of the second marking in the first sub image is arranged on the second image position of the second marking in the second sub image,
wherein the method comprises generating only two images of regions of the object, the first sub image and the second sub image, the first sub image not including a marking.

13. The computer program product claim 12, wherein the first sub image is an only image generated specifically for the first object region.

14. A particle beam device for analyzing an object, comprising:
a particle generator for generating a particle beam having charged particles;
an objective lens for focusing the particle beam onto the object;
a detection unit for detecting interaction particles and/or interaction radiation; and
a processor into which a computer program product is loaded, the computer program product causing the processor to execute the following steps:
determining a first object region of the object;
guiding the particle beam to the first object region;
generating a first sub image of the first object region, wherein generating the first sub image includes detecting first interaction particles and/or first interaction radiation with the detection unit, wherein the first interaction particles and the first interaction radiation arise from an interaction of the particle beam with the object when the particle beam impinges on the object;

arranging at least a first marking in the first object region at a first object position in an object coordinate system, and arranging at least a second marking in the first object region at a second object position in the object coordinate system;

calculating a first image position of the first marking in the first sub image in an image coordinate system, the first image position corresponding to the first object position in the object coordinate system;

calculating a second image position of the second marking in the first sub image in the image coordinate system, the second image position corresponding to the second object position in the object coordinate system;

determining a second object region of the object, the second object region comprising a common region with the first object region, wherein the common region comprises the first marking and the second marking;

guiding the particle beam to the second object region;

generating a second sub image of the second object region, wherein generating the second sub image includes detecting second interaction particles and/or second interaction radiation with the detection unit, wherein the second interaction particles and the second interaction radiation arise from an interaction of the particle beam with the object when the particle beam impinges on the object;

determining a first image position of the first marking in the second sub image in the image coordinate system and determining a second image position of the second marking in the second sub image in the image coordinate system; and generating a composite image by relatively arranging the first sub image to the second sub image such that the first sub image overlaps the second sub image in the entire common region, the calculated first image position of the first marking in the first sub image is arranged on the first image position of the first marking in the second sub image, and the calculated second image position of the second marking in the first sub image is arranged on the second image position of the second marking in the second sub image, wherein the steps comprise generating only two images of regions of the object, the first sub image and the second sub image, the first sub image not including a marking.

15. The particle beam device according to claim 14, wherein the particle generator is a first particle beam generator for generating a first particle beam having first charged particles, wherein the objective lens is a first objective lens for focusing the first particle beam onto the object, and wherein the particle beam device further comprises:

a second particle beam generator for generating a second particle beam having second charged particles and a second objective lens for focusing the second particle beam onto the object.

16. The particle beam device according to claim 14, wherein the particle beam device is at least one of the following: an electron beam device and an ion beam device.

17. The particle beam device according to claim 14, wherein the particle beam device includes a plasma cleaning unit.

18. The particle beam device of claim 14, wherein the first sub image is an only image generated specifically for the first object region.

* * * * *

UNITED STATES PATENT AND TRADEMARK OFFICE

CERTIFICATE OF CORRECTION

PATENT NO. : 10,504,691 B2
APPLICATION NO. : 15/490934
DATED : December 10, 2019
INVENTOR(S) : Luyang Han It is certified that error appears in the above-identified patent and that said Letters Patent is hereby corrected as shown below:

In the Claims

Column 27, Line 22:
Claim 9, the phrase "The method according claim 1" should read --The method according to claim 1--

Column 28, Line 44:
Claim 13, the phrase "The computer program product claim 12" should read --The computer program product according to claim 12--

Signed and Sealed this
Eighth Day of September, 2020

Andrei Iancu
*Director of the United States Patent and Trademark Office*